(12) United States Patent
Byeon et al.

(10) Patent No.: US 12,543,346 B2
(45) Date of Patent: Feb. 3, 2026

(54) SEMICONDUCTOR DEVICES

(71) Applicant: Samsung Electronics Co., Ltd., Suwon-si (KR)

(72) Inventors: Hyohoon Byeon, Suwon-si (KR); Sungkeun Lim, Suwon-si (KR); Dohyun Go, Suwon-si (KR); Unki Kim, Suwon-si (KR); Yuyeong Jo, Suwon-si (KR); Jinyeong Joe, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 403 days.

(21) Appl. No.: 18/189,538

(22) Filed: Mar. 24, 2023

(65) Prior Publication Data
US 2023/0387234 A1 Nov. 30, 2023

(30) Foreign Application Priority Data
May 31, 2022 (KR) ........................ 10-2022-0066751

(51) Int. Cl.
*H01L 29/66* (2006.01)
*H01L 29/06* (2006.01)
(Continued)

(52) U.S. Cl.
CPC ......... *H10D 30/6735* (2025.01); *H10D 30/43* (2025.01); *H10D 30/6757* (2025.01);
(Continued)

(58) Field of Classification Search
CPC .... H10D 30/014; H10D 30/024; H10D 30/43; H10D 30/62; H10D 30/6211;
(Continued)

(56) References Cited

U.S. PATENT DOCUMENTS 6,410,371 B1    6/2002  Yu et al.
7,691,698 B2    4/2010  Chidambarrao et al.
(Continued)

FOREIGN PATENT DOCUMENTS

DE    102018108821 A1    4/2019

OTHER PUBLICATIONS

Bindu et al. "Analytical Model of Drain Current of Si/SiGe Heterostructure p-Channel MOSFETs for Circuit Simulation" IEEE Transactions on Electron Devices 53(6) (Jun. 2006).
(Continued)

*Primary Examiner* — David C Spalla
(74) *Attorney, Agent, or Firm* — Wolf, Greenfield & Sacks, P.C.

(57) ABSTRACT

A semiconductor device includes a substrate including an active region extending in a first direction, a gate structure intersecting the active region on the substrate and extending in a second direction, a plurality of channel layers spaced apart from each other in a third direction, perpendicular to an upper surface of the substrate, on the active region and surrounded by the gate structure, and source/drain regions in recess regions of the active region, on opposite sides adjacent to the gate structure and electrically connected to the plurality of channel layers. Each of the plurality of channel layers includes first to third semiconductor layers sequentially stacked in the third direction, the first and third semiconductor layers include silicon (Si), and the second semiconductor layer includes silicon-germanium (SiGe). Side surfaces of the first to third semiconductor layers in the second direction are in contact with the gate structure.

18 Claims, 20 Drawing Sheets

(51) Int. Cl.
*H01L 29/775* (2006.01)
*H01L 29/786* (2006.01)
*H10D 30/43* (2025.01)
*H10D 30/67* (2025.01)
*H10D 62/10* (2025.01)
*H10D 64/01* (2025.01)

(52) U.S. Cl.
CPC ......... *H10D 62/121* (2025.01); *H10D 64/017* (2025.01); *H10D 64/018* (2025.01)

(58) Field of Classification Search
CPC ........... H10D 30/6212; H10D 30/6213; H10D 30/6735; H10D 30/6757; H10D 62/118; H10D 62/119; H10D 62/121; H10D 64/015; H10D 64/018; H10D 64/021; H10D 84/0158; H10D 84/0193; H10D 84/834; H10D 84/853
See application file for complete search history.

(56) References Cited

U.S. PATENT DOCUMENTS

| | | |
|---|---|---|
| 10,529,738 B2 | 1/2020 | Purakh et al. |
| 2002/0008289 A1 | 1/2002 | Murota et al. |
| 2002/0125475 A1 | 9/2002 | Chu et al. |
| 2007/0196987 A1 | 8/2007 | Chidambarrao et al. |
| 2015/0372104 A1 | 12/2015 | Liu et al. |
| 2017/0018610 A1 | 1/2017 | Suk et al. |
| 2017/0345915 A1* | 11/2017 | Coquand ............ H10D 30/6735 |
| 2019/0035923 A1 | 1/2019 | Sadana et al. |
| 2019/0058051 A1 | 2/2019 | Kim et al. |
| 2019/0103317 A1 | 4/2019 | Yu et al. |
| 2019/0157422 A1* | 5/2019 | Reboh .................. H10D 62/121 |
| 2019/0198645 A1* | 6/2019 | Cheng ................ H10D 30/6713 |
| 2020/0105750 A1 | 4/2020 | Xiao |
| 2020/0251474 A1 | 8/2020 | Reznicek et al. |
| 2020/0312658 A1 | 10/2020 | Miura et al. |
| 2021/0043763 A1 | 2/2021 | Jung et al. |
| 2022/0037505 A1 | 2/2022 | Wan et al. |
| 2023/0178598 A1* | 6/2023 | Ando .................. H10D 84/014 257/288 |

OTHER PUBLICATIONS

Cheng et al. "Electron Mobility Enhancement in Strained-Si n-MOSFETs Fabricated on SiGe-on-Insulator (SGOI) Substrates" IEEE Electron Device Letters 22(7):321-323 (Jul. 2001).

Cheng et al. "SiGe-On-Insulator (SGOI): Two Structures for CMOS Application" Department of Materials Science and Engineering, Massachusetts Institute of Technology (2003).

Collaert et al. "High-Performance Strained Si/SiGe pMOS Devices With Multiple Quantum Wells" IEEE Transactions on Nanotechnology 1(4):190-194 (Dec. 2002).

Dhar et al. "Analysis of Capacitance—Voltage Characteristics for Ultrathin Si/SiGe/Si Hetero-Layered MOS Structure" Advances in Intelligent Systems and Computing (2020).

Fitzgerald et al. "MOSFET Channel Engineering using Strained Si, SiGe, and Ge Channels" Advanced Materials for Micro-and Nano-Systems (AMMNS) (2003).

Shii et al. "Low Temperature Plasma Process for Si/SiGe Dual Channel Fin Application" Electron Devices Technology and Manufacturing Conference (2019).

Khiangte et al. "TCAD Modelling of 30nm Strained-Si/SiGe/Si Channel MOSFET" 2019 Devices for Integrated Circuit (Mar. 23-24, 2019).

Khiangte Et al. "Sub-50nm Tri-layered Strained Si/SiGe/Si Channel nMOSFET" International Journal of Innovative Technology and Exploring Engineering 8(6S):361-364 (Apr. 2019).

Olsen et al. "Study of Single- and Dual-Channel Designs for High-Performance Strained-Si—SiGe n-MOSFETs" IEEE Transactions on Electron Devices 51(7):1245-1253 (Jul. 2004).

Shi et al. "Simulation and optimization of strained Si1-xGex buried channel p-MOSFETs" Solid-State Electronics 44:1223-1228 (2000).

Shima et al. "High Drive Current NMOS With Si—SiGe Heterostructure Low Electric Field Channel" IEEE Electron Device Letters 25(10):699-701 (Oct. 2004).

Wang et al. "Strained pMOSFETs with SiGe Channel and Embedded SiGe Source/Drain Stressor under Heating and Hot-Carrier Stresses" IEEE 2nd International Symposium on Next-Generation Electronics (2013).

Yu et al. "Strained-Si-Strained-SiGe Dual-Channel Layer Structure as CMOS Substrate for Single Workfunction Metal-Gate Technology" IEEE Electron Device Letters 25(6):402-404 (Jun. 2004).

Extended European Search Report corresponding to European Application No. 23170647.4 (9 pages) (Oct. 26, 2023).

* cited by examiner

SEMICONDUCTOR DEVICES

CROSS-REFERENCE TO RELATED APPLICATION(S)

This application claims the benefit of priority to Korean Patent Application No. 10-2022-0066751 filed on May 31, 2022 in the Korean Intellectual Property Office, the disclosure of which is incorporated herein by reference in its entirety.

BACKGROUND

The present disclosure relates to semiconductor devices.

As demand for high performance, high speed, and/or multifunctionality in semiconductor devices increases, the degree of integration of semiconductor devices has increased. When a semiconductor device corresponding to the trend for high integration in semiconductor devices is fabricated, the semiconductor device may include patterns having fine widths or fine spacings therebetween. Moreover, to overcome limitations of operating characteristics caused by a reduction in size of a planar metal oxide semiconductor FET (MOSFET), efforts have been made to develop a semiconductor device including a FinFET having a channel with a three-dimensional structure.

SUMMARY

Example embodiments provide a semiconductor device having improved electrical characteristics and mass producibility.

According to an example embodiment, a semiconductor device includes: a substrate including an active region extending in a first direction; a gate structure intersecting the active region on the substrate and extending in a second direction; a plurality of channel layers spaced apart from each other in a third direction, perpendicular to an upper surface of the substrate, on the active region and surrounded by the gate structure; and source/drain regions in recess regions of the active region, on opposite sides adjacent to the gate structure and electrically connected to the plurality of channel layers. Each of the plurality of channel layers includes first to third semiconductor layers sequentially stacked in the third direction, such that the second semiconductor layer is between the first and third semiconductor layers, the first and third semiconductor layers include silicon (Si), and the second semiconductor layer includes silicon-germanium (SiGe). Side surfaces of the first to third semiconductor layers in the second direction are in contact with the gate structure.

According to an example embodiment, a semiconductor device includes: a substrate having first and second regions and including first and second active regions, respectively extending in the first and second regions in a first direction; a first gate structure intersecting the first active region on the first region and extending in a second direction; a second gate structure intersecting the second active region on the second region and extending in the second direction; a plurality of channel layers spaced apart from each other in a third direction, perpendicular to an upper surface of the substrate, on each of the first and second active regions and surrounded by each of the first and second gate structures; first source/drain regions on opposite sides adjacent to the first gate structure and electrically connected to the plurality of channel layers; and second source/drain regions on opposite sides adjacent to the second gate structure and electrically connected to the plurality of channel layers. Each of the plurality of channel layers includes first to third semiconductor layers sequentially stacked in the third direction such that the second semiconductor layer is between the first and third semiconductor layers, and extending parallel to each other in the first and second directions, and at least one of the first to third semiconductor layers includes silicon-germanium (SiGe).

According to an example embodiment, a semiconductor device includes: a substrate including an active region extending in a first direction; a gate structure intersecting the active region on the substrate and extending in a second direction; a plurality of channel layers spaced apart from each other in a third direction, perpendicular to an upper surface of the substrate, on the active region and surrounded by the gate structure; and source/drain regions in recess regions of the active region, on opposite sides adjacent to the gate structure and electrically connected to the plurality of channel layers. Each of the plurality of channel layers includes first and second semiconductor layers sequentially stacked, such that the first semiconductor layer is below the second semiconductor layer, and the second semiconductor layer includes silicon-germanium (SiGe), and side surfaces of the first and second semiconductor layers in the second direction are coplanar with each other.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings. In the descriptions below, terms "upper," "upper portion," "upper surface," "lower," "lower portion," "lower surface," "side surface," and the like, are used with reference to the diagrams unless otherwise indicated.

Figure 1:
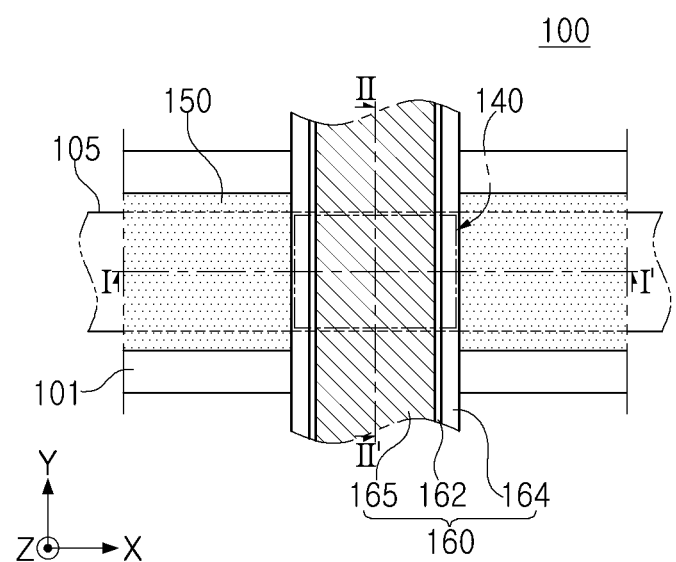
FIG. 1 is a plan view illustrating a semiconductor device according to example embodiments.

FIG. 1 is a plan view illustrating a semiconductor device according to example embodiments.

Figure 2:
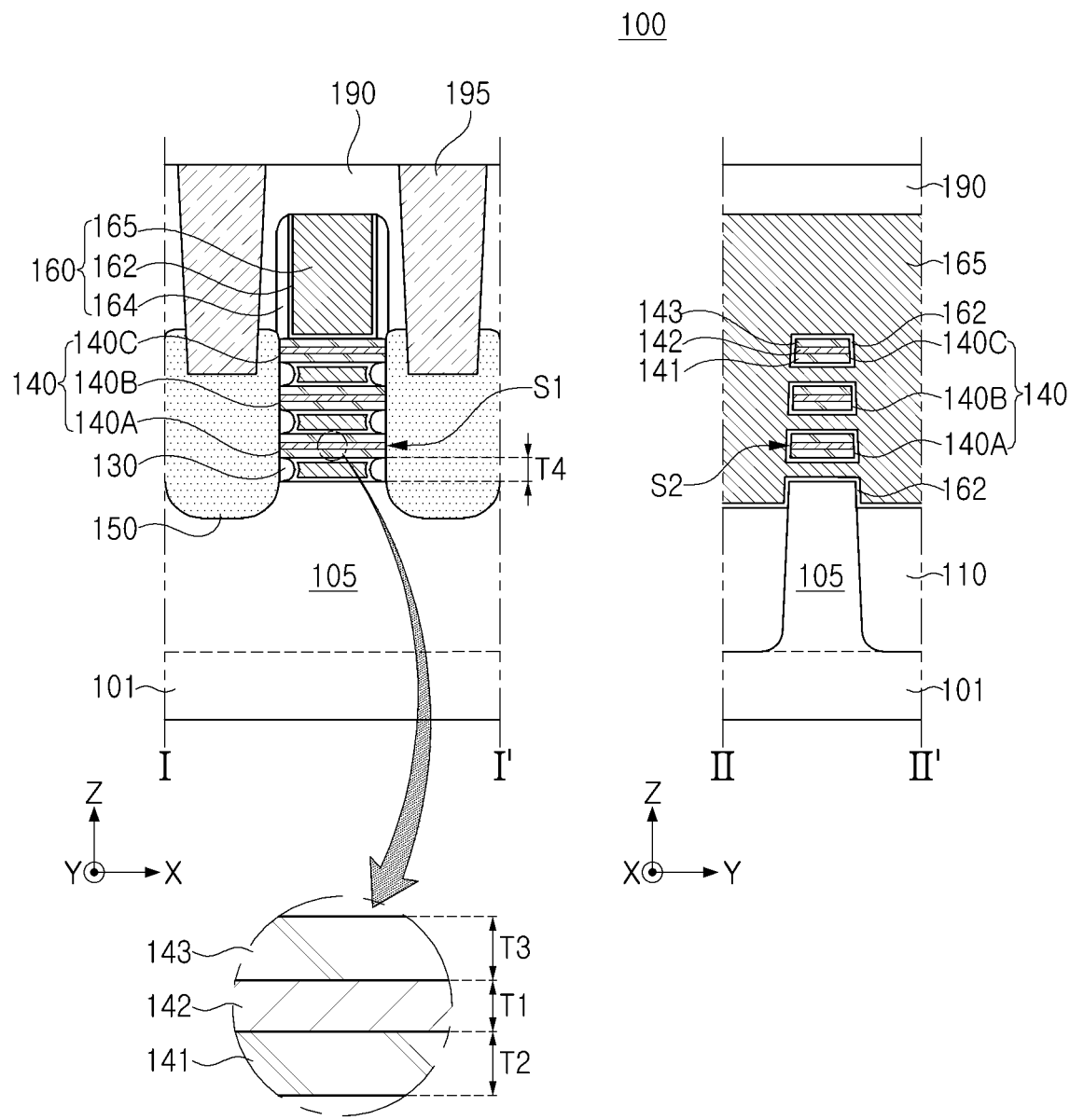
FIG. 2 is a cross-sectional view illustrating a semiconductor device according to example embodiments.

FIG. 2 is a cross-sectional view illustrating a semiconductor device according to example embodiments. FIG. 2 illustrates cross-sections of the semiconductor device of FIG. 1 taken along lines I-I' and II-Ir. For ease of description, only major components of the semiconductor device are illustrated in FIG. 1.

Referring to FIGS. 1 and 2, a semiconductor device 100 may include a substrate 101 including an active region 105, a channel structure 140 including first to third channel layers 140A, 140B, and 140C vertically spaced apart from each other on the active region 105, a gate structure 160 extending on the substrate 101 and intersecting the active region 105 and including a gate electrode 165, source/drain regions 150 contacting the channel structure 140, and contact plugs 195 electrically connected to the source/drain regions 150. The semiconductor device 100 may further include an isolation layer 110, internal spacer layers 130, gate dielectric layers 162, gate spacer layers 164, and an interlayer insulating layer 190.

In the semiconductor device 100, the active region 105 may have a fin structure, and the gate electrode 165 may be disposed between the active region 105 and the channel structure 140, between the first to third channel layers 140A, 140B, and 140C, and on the channel structure 140. Accordingly, the semiconductor device 100 may include transistors having a multi-bridge channel FET (MBCFET™) structure, gate-all-around type field effect transistors.

The substrate 101 may have an upper surface extending in an X-direction and a Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The substrate 101 may include an active region 105 disposed thereon. The active region 105 may be defined by the isolation layer 110 in the substrate 101 and may be disposed to extend in a first direction, for example, the X-direction. However, the active region 105 may be described as a structure separate from the substrate 101 according to a description method. A portion of the active region 105 may protrude upwardly of the isolation layer 110, so that an upper surface of the active region 105 may be positioned on a level higher than a level of an upper surface of the isolation layer 110. The active region 105 may be formed as a portion of the substrate 101, or may include an epitaxial layer grown from the substrate 101. However, a portion of the active region 105 may be recessed on opposite sides of the gate structure 160 to form recess regions, and source/drain regions 150 may be disposed in the recess regions.

In example embodiments, the active region 105 may or may not include a well region including impurities. For example, in the case of a P-type transistor (pFET), the well region may include N-type impurities such as phosphorus (P), arsenic (As), or antimony (Sb). As another example, in the case of an N-type transistor (nFET), the well region may include P-type impurities such as boron (B), gallium (Ga), or aluminum (Al). The well region may be disposed, for example, at a predetermined depth from an upper surface of the active region 105.

The isolation layer 110 may define an active region 105 in the substrate 101. The isolation layer 110 may be formed by, for example, a shallow trench isolation (STI) process. The isolation layer 110 may expose the upper surface of the active region 105, or may expose a portion of an upper portion of the active region 105. In some embodiments, the isolation layer 110 may have a curved upper surface to have a level becoming higher in a direction toward the active region 105. The isolation layer 110 may be formed of an insulating material. The isolation layer 110 may be, for example, an oxide, a nitride, or a combination thereof.

The gate structure 160 may be disposed on the active region 105 and the channel structure 140 to intersect the active region 105 and the channel structure 140 to extend in a second direction, for example, the Y-direction. In the active region and/or the channel structure intersecting the gate electrode 165 of the gate structure, a channel region may be formed in terms of functions of transistors. The gate structure 160 may include a gate electrode 165, gate dielectric layers 162 between the gate electrode 165 and the first to third channel layers 140A, 140B, and 140C, and gate spacer layers 164 on side surfaces of the gate electrode 165. In example embodiments, the gate structure 160 may further include a capping layer on an upper surface of the gate electrode 165. Moreover, a portion of the interlayer insulating layer 190 on the gate structure 160 may serve as a gate capping layer.

The gate dielectric layers 162 may be disposed between the active region 105 and the gate electrode 165 and between the channel structure 140 and the gate electrode 165, and may be disposed to cover at least a portion of surfaces of the gate electrode 165. For example, the gate dielectric layers 162 may be disposed to surround all surfaces, other than an uppermost surface of the gate electrode 165. The gate dielectric layers 162 may extend between the gate electrode 165 and the gate spacer layers 164, but example embodiments are not limited thereto. The gate dielectric layer 162 may include an oxide, a nitride, or a high-s dielectric material. The high-K dielectric material may refer to a dielectric material having a dielectric constant higher than a dielectric constant of silicon oxide ($SiO_2$). The high-K dielectric material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_x O_y$), and praseodymium oxide ($Pr_2O_3$). In some embodiments, the gate dielectric layer 162 may have a multilayer structure.

The gate electrode 165 may be disposed on the active region 105 in (e.g., to fill) spaces between the first to third channel layers 140A, 140B, and 140C and to extend upwardly of the channel structure 140. The gate electrode 165 may be spaced apart from the first to third channel layers 140A, 140B, and 140C by the gate dielectric layers 162. The gate electrode 165 may include a conductive material, for example, metal nitride such as titanium nitride (TiN), tantalum nitride (TaN), or tungsten nitride (WN), and/or metal such as aluminum (Al), tungsten (W), or molybdenum (Mo), or a semiconductor material such as doped polysilicon. In some embodiments, the gate electrode 165 may have a multilayer structure including two or more layers.

The gate spacer layers 164 may be disposed on opposite side surfaces of the gate electrode 165 on the channel structure 140. The gate spacer layers 164 may insulate the source/drain regions 150 from the gate electrode 165. According to example embodiments, the gate spacer layers 164 may have a multilayer structure. The gate spacer layers 164 may be formed of an oxide, a nitride, or an oxynitride, in particular, a low-K dielectric material.

The channel structure 140 may be disposed on the active region 105 in regions in which the active region 105 intersects the gate structure 160. The channel structure 140 may include first to third channel layers 140A, 140B, and 140C, which are a plurality of channel layers disposed to be spaced apart from each other in a Z-direction. The first to third channel layers 140A, 140B, and 140C may be sequentially disposed on the active region 105. The channel structure 140 may be electrically connected to the source/drain regions 150. The channel structure 140 may have a width smaller than or equal to a width of the active region 105 in the Y-direction, and may have a width equal to or similar to a width of the gate structure 160 in the X-direction. In some embodiments, the channel structure 140 may have a reduced width such that first side surfaces S1 of the channel structure 140 are disposed below (e.g., are vertically overlapped by) the gate structures 160 in the Z-direction. The number and shape of the channel layers constituting a single channel structure 140 may vary according to example embodiments.

Each of the first to third channel layers 140A, 140B, and 140C may include first to third semiconductor layers 141, 142, and 143 sequentially stacked in the Z-direction, such that the second semiconductor layer 142 is between, in the Z-direction, the first semiconductor layer 141 and the third semiconductor layer 143. Each of the first to third semiconductor layers 141, 142, and 143 may extend in the X-direction and the Y-direction, parallel to an upper surface of the substrate 101, and may have a planar upper surface. For example, each of the first to third semiconductor layers 141, 142, and 143 may be a respective planar layer that has an upper surface that is parallel to an upper surface of the substrate 101. Accordingly, none of the first to third semiconductor layers 141, 142, and 143 may surround/enclose another of the first to third semiconductor layers 141, 142, and 143 (e.g., the first semiconductor layer 141 may not surround/enclose either the second semiconductor layer 142 or the third semiconductor layer 143). Each of the first to third semiconductor layers 141, 142, and 143 may not include a region extending/protruding in the Z-direction. In the first to third semiconductor layers 141, 142, and 143, the first side surfaces S1 in the X-direction may be in contact with the source/drain regions 150 and second side surfaces S2 in the Y-direction may be in contact with the gate dielectric layers 162 of the gate structure 160. In each of the first to third channel layers 140A, 140B, and 140C, the first side surfaces S1 of the first to third semiconductor layers 141, 142, and 143 are coplanar with each other (e.g., in the Y-Z plane) and the second side surfaces S2 may also be coplanar with each other (e.g., in the X-Z plane).

The first to third semiconductor layers 141, 142, and 143 may extend to have substantially the same length in the X-direction. The first to third semiconductor layers 141, 142, and 143 may extend to have the same or similar length in the Y-direction, for example, may have a length difference caused by inclination of the second side surfaces S2. In a cross-section in the X-direction (e.g., along the line I-I'), the first and third semiconductor layers 141 and 143 may further be in contact with upper and lower internal spacer layers 130. The first side surfaces S1 of the first to third semiconductor layers 141, 142, and 143 may also be coplanar (e.g., in the Y-Z plane) with external surfaces of the internal spacer layers 130 in the X-direction, but example embodiments are not limited thereto. In a cross-section in the Y-direction (e.g., along the line II-II'), the gate dielectric layer 162 may surround each of the first to third channel layers 140A, 140B, and 140C. The gate dielectric layer 162 may extend along a lower surface of the first semiconductor layer 141, the second side surfaces S2 of the first to third semiconductor layers 141, 142, and 143, and an upper surface of the third semiconductor layer 143.

The first to third semiconductor layers 141, 142, and 143 may have the same thickness or different thicknesses in the Z-direction. A thickness T1 (in the Z-direction) of the second semiconductor layer 142 may be smaller than or equal to a thickness T2 (in the Z-direction) of the first semiconductor layer 141 and a thickness T3 (in the Z-direction) of the third semiconductor layer 143. In some embodiments, the thickness T1 of the second semiconductor layer 142 may be greater than to or equal to the thickness T2 of the first semiconductor layer 141 and the thickness T3 of the third semiconductor layer 143. For example, in each of the first to third channel layers 140A, 140B, and 140C, a sum of the thicknesses of the first to third semiconductor layers 141, 142 and 143 may be within a range of about 30 angstroms to about 100 angstroms. The sum of the thicknesses may be smaller than or equal to the thickness T4 of the gate structure 160 below the first to third channel layers 140A, 140B, and 140C. However, relative sizes of the thicknesses T1 to T4 may vary according to embodiments. In some embodiments, in each of the first to third channel layers 140A, 140B, and 140C, the sum of the thicknesses of the first to third semiconductor layers 141, 142, and 143 may be greater than the thickness T4.

The first and third semiconductor layers 141 and 143 may include the same semiconductor material, and the second semiconductor layer 142 may include a semiconductor material different from the semiconductor material of the first and third semiconductor layers 141 and 143. A content of germanium (Ge) in the second semiconductor layer 142 may be higher than a content of germanium (Ge) in the first and third semiconductor layers 141 and 143. For example, the first and third semiconductor layers 141 and 143 may include silicon (Si), and the second semiconductor layer 142 may include silicon-germanium (SiGe). For example, the second semiconductor layer 142 may include germanium (Ge) in a range of about 5 atomic percentage (at %) to about 50 at %, for example, a range of about 5 at % to about 25 at %. In some embodiments, the first to third semiconductor layers 141, 142, and 143 or the second semiconductor layer 142 may further include at least one doping element among carbon (C), arsenic (As), indium (In), or gallium (Ga), phosphorus (P), or boron (B). In some embodiments, the first and third semiconductor layers 141 and 143 may also include a portion of silicon-germanium (SiGe) in a region adjacent to the second semiconductor layer 142. Even in this case, the content of germanium (Ge) in the first and third semiconductor layers 141 and 143 may be lower than the content of germanium (Ge) in the second semiconductor layer 142.

The second semiconductor layer 142 includes germanium (Ge) having a relatively larger atomic size than silicon (Si), and thus may have compressive stress in relation to the first and third semiconductor layers 141 and 143, and the overlying and underlying first and third semiconductor layers 141 and 143 may receive relatively tensile stress. Accordingly, the first to third semiconductor layers 141, 142, and 143 may be in a strained state, for example, may be a strained-silicon (Si) layer or a strained silicon-germanium (SiGe) layer. A conduction path of holes may be formed by two-dimensional hole gas (2DHG) present at an interface between the first and third semiconductor layers 141 and 143 and the second semiconductor layer 142 having different stresses, and a conduction path of electrons may be formed along the first and third semiconductor layers 141 and 143.

Accordingly, mobility of both the electrons and the holes may be improved. As a result, electrical characteristics may be improved in both a case in which the semiconductor device 100 is a pFET and a case in which the semiconductor device 100 is an nFET, and the channel structure 140 may be a dual channel which may be applied to both a pFET and an nFET.

The source/drain regions 150 may be disposed in recess regions, in which an upper portion of the active region is partially recessed, on opposite sides adjacent to the gate structure 160. The source/drain region 150 may be disposed to cover the first side surfaces S1 of each of the first to third channel layers 140A, 140B, and 140C of the channel structure 140. Upper surfaces of the source/drain regions 150 may be disposed at a height the same as or similar to a height of a lower surface of the uppermost region of the gate electrode 165, and the height of the upper surfaces may vary according to example embodiments. The source/drain regions 150 may include a semiconductor material, for example, silicon (Si) or germanium (Ge) and may further include impurities.

Internal spacer layers 130 may be disposed to be parallel to the gate electrode 165 between the first to third channel layers 140A, 140B, and 140C in the Z-direction. The gate electrode 165 may be stably spaced apart from the source/drain regions 150 by the internal spacer layers 130 to be electrically separated/isolated from each other. The internal spacer layers 130 may have a shape in which a side surface facing the gate electrode 165 is convexly rounded inwardly of the gate electrode 165, but example embodiments are not limited thereto. The internal spacer layers 130 may be formed of an oxide, a nitride, or an oxynitride and, in particular, a low-K dielectric material. In some embodiments, the internal spacer layers 130 may be omitted.

The interlayer insulating layer 190 may cover the source/drain regions 150 and the gate structures, and may be disposed to cover the isolation layer 110. The interlayer insulating layer 190 may include at least one of an oxide, a nitride, or an oxynitride and may include, for example, a low-K dielectric material. In some embodiments, the interlayer insulating layer 190 may include a plurality of insulating layers.

The contact plugs 195 may extend into (e.g., penetrate through) the interlayer insulating layer 190 to be electrically connected to the source/drain regions 150, and may apply an electrical signal to the source/drain regions 150. Each of the contact plugs 195 may have an inclined surface in which a width of a lower portion is narrower than a width of an upper portion depending on an aspect ratio, but a shape of the surface of each of the contact plug 195 is not limited thereto. The contact plugs 195 may extend downwardly farther than, for example, a lower surface of an uppermost third channel layer 140C of the channel structure 140 from above, but example embodiments are not limited thereto. In example embodiments, the contact plugs 195 may be disposed to be in contact with the upper surfaces of the source/drain regions 150 without recessing the source/drain regions 150.

The contact plugs 195 may include a metal silicide layer disposed on a lower end including a lower surface, and may further include a barrier layer extending upwardly of an upper surface of the metal silicide layer while forming side surfaces of the contact plugs 195. The barrier layer may include, for example, a metal nitride such as a titanium nitride layer (TiN), a tantalum nitride layer (TaN), or a tungsten nitride layer (WN). The contact plugs 195 may include, for example, a metal material such as aluminum (Al), tungsten (W), or molybdenum (Mo). The number and disposition of conductive layers constituting the contact plugs 195 may vary according to example embodiments. An interconnection structure such as a contact plug may be further disposed on the gate electrode 165, and an interconnection structure electrically connected to the contact plugs 195 may be further disposed on the contact plugs 195.

In the following description of embodiments, descriptions overlapping the above descriptions provided with reference to FIGS. 1 and 2 will be omitted.

Figure 3A:
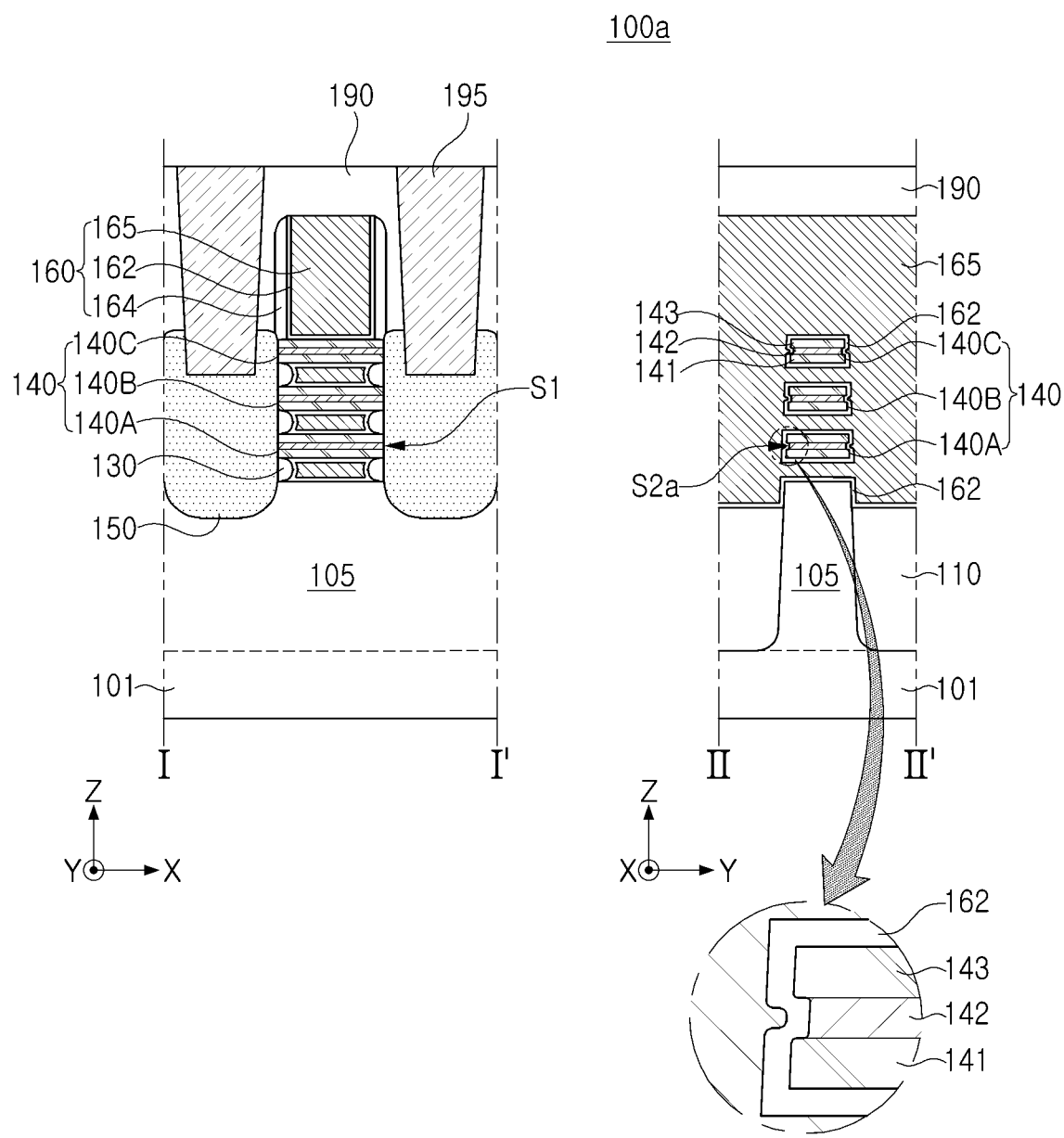
FIGS. 3A and 3B are schematic cross-sectional views illustrating a semiconductor device according to example embodiments.
Figure 3B:
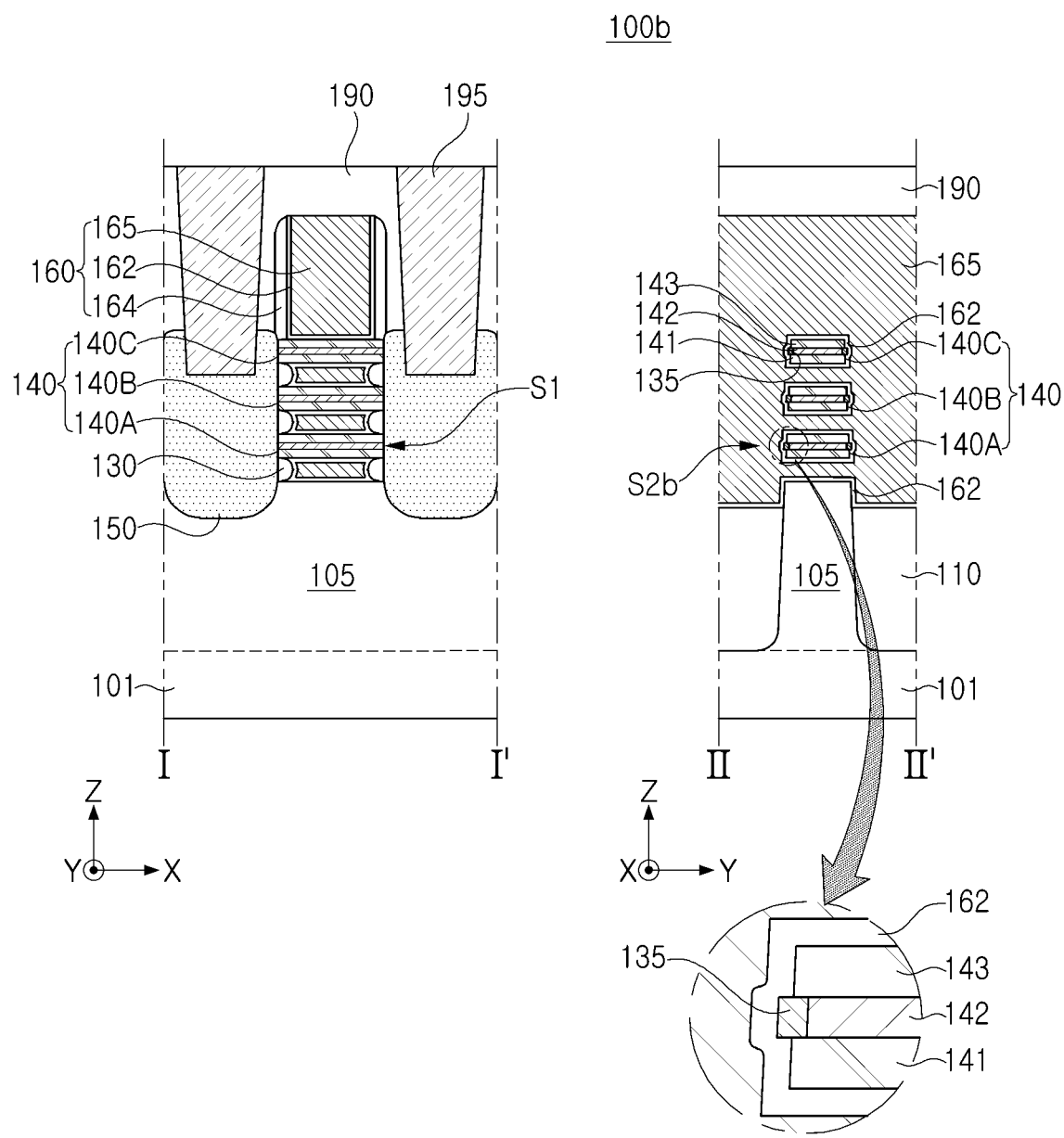

FIGS. 3A and 3B are schematic cross-sectional views illustrating semiconductor devices according to example embodiments. FIGS. 3A and 3B illustrate regions corresponding to FIG. 2, respectively.

Referring to FIG. 3A, in a semiconductor device 100a, a second semiconductor layer 142 of each of first to third channel layers 140A, 140B, and 140C may have a shape in which second side surfaces S2a in a Y-direction are recessed inwardly of a center. Accordingly, the second side surfaces S2a of the second semiconductor layer 142 may be disposed inside of the second side surfaces S2a of the first and third semiconductor layers 141 and 143, and may not be coplanar with the second side surfaces S2a of the first and third semiconductor layers 141 and 143. A width in the Y-direction of the second semiconductor layer 142 may thus be narrower than respective widths in the Y-direction of the first and third semiconductor layers 141, 143. The recessed degree and shape of the second side surfaces S2a of the second semiconductor layer 142 may vary according to example embodiments.

Referring to FIG. 3B, a semiconductor device 100b may further include side protection layers 135 disposed on second side surfaces S2b of a second semiconductor layer 142 of each of first to third channel layers 140A, 140B, and 140C.

The side protection layers 135 may be disposed on second side surfaces S2b of the second semiconductor layer 142 between a first semiconductor layer 141 and a third semiconductor layer 143. External surfaces of the side protection layers 135 may be disposed outside of the second side surfaces S2b of the first and third semiconductor layers 141 and 143, but example embodiments are not limited thereto.

The side protection layers 135 may include a material different from a material of the second semiconductor layer 142 and may not include, for example, germanium (Ge). For example, the side protection layers 135 may include an insulating material, but example embodiments are not limited thereto. The side protection layers 135 may include at least one of, for example, SiO, SiN, SiCN, SiOC, SiON, or SiOCN.

Figure 4A:
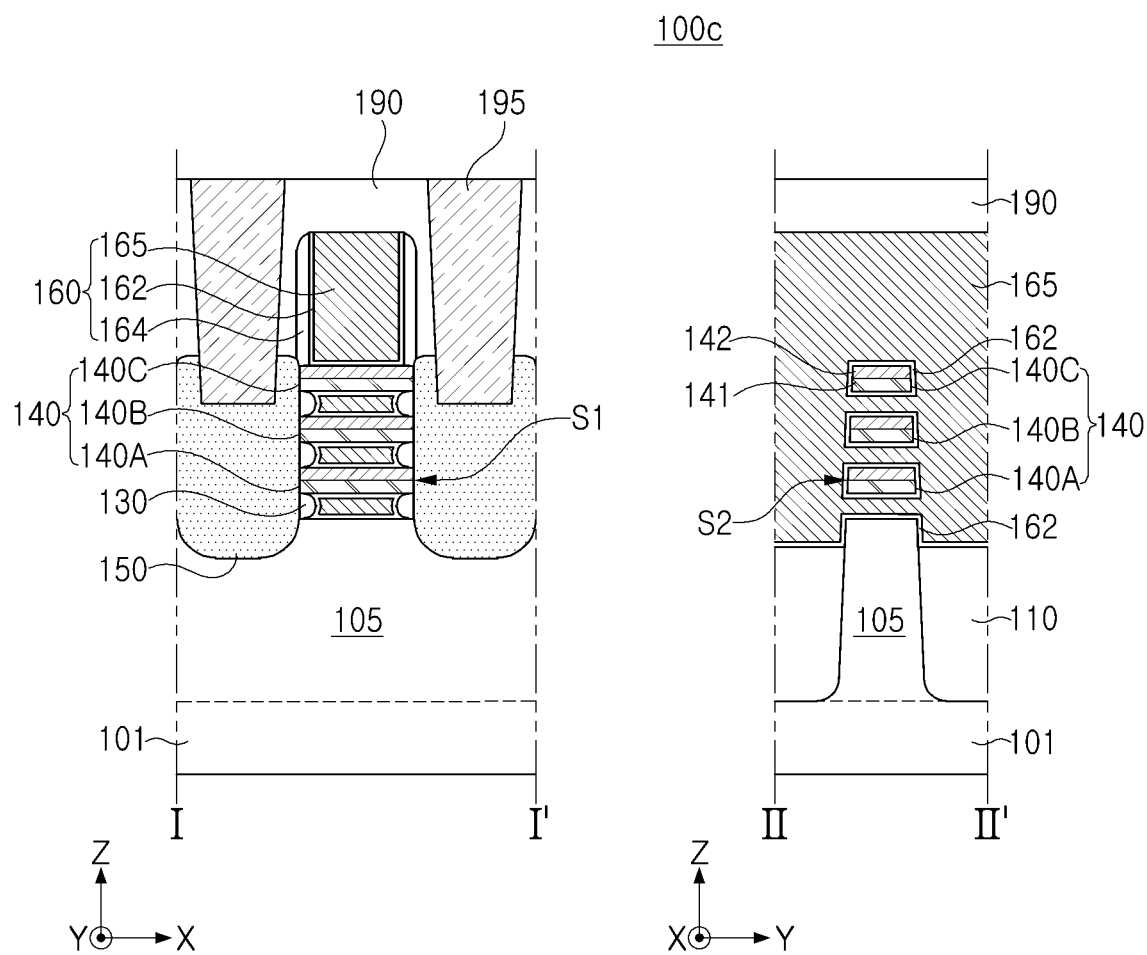
FIGS. 4A to 4C are schematic cross-sectional views illustrating a semiconductor device according to example embodiments.
Figure 4B:
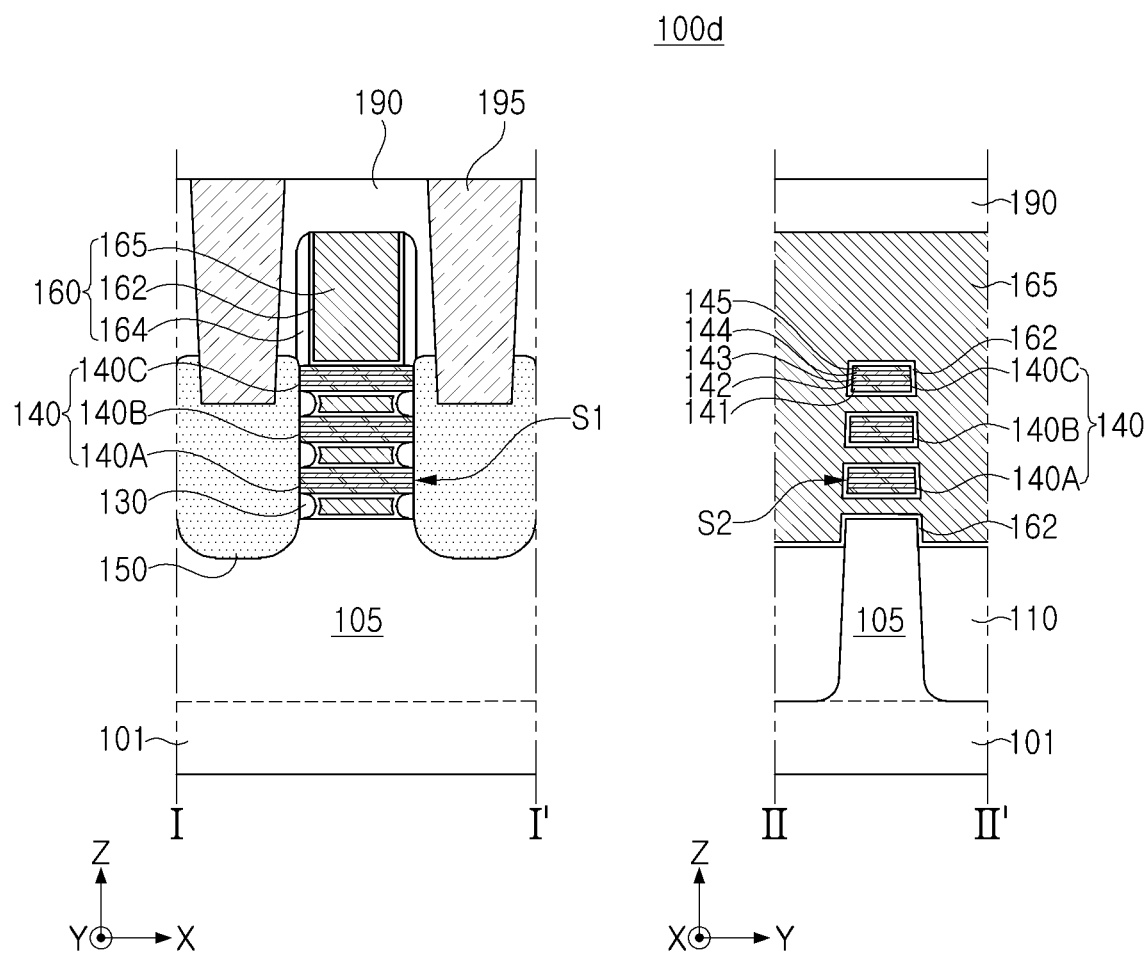
Figure 4C:
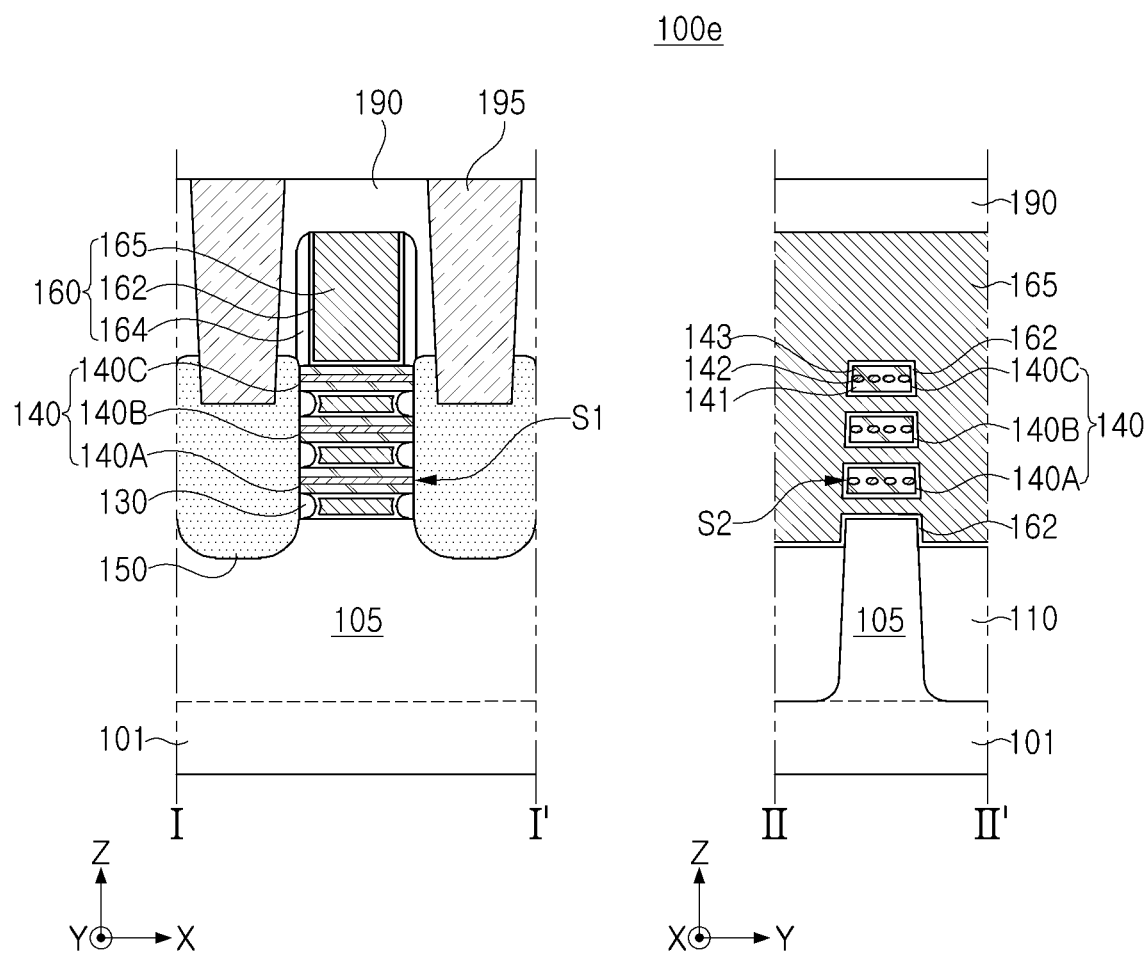

FIGS. 4A to 4C are schematic cross-sectional views illustrating a semiconductor device according to example embodiments. FIGS. 4A to 4C illustrate regions corresponding to FIG. 2.

Referring to FIG. 4A, in a semiconductor device 100c, first to third channel layers 140A, 140B, and 140C may each include first and second semiconductor layers 141 and 142 sequentially stacked in a Z-direction. Accordingly, the first semiconductor layer 141 may be below the second semiconductor layer 142.

The first semiconductor layer 141 and the second semiconductor layer 142 may include different semiconductor materials. For example, the first semiconductor layer 141 may include silicon (Si), and the second semiconductor layer 142 may include silicon-germanium (SiGe), or vice versa. The first and second semiconductor layers 141 and 142 may be in a strained state. In addition thereto, the above descriptions provided with reference to FIGS. 1 and 2 may be equally applied to the first and second semiconductor layers 141 and 142. As an example, the second side surfaces S2 of the first and second semiconductor layers 141 and 142 may be coplanar with each other (e.g., in the X-Z plane).

Referring to FIG. 4B, in a semiconductor device 100d, first to third channel layers 140A, 140B, and 140C may each include first to fifth semiconductor layers 141, 142, 143, 144, and 145 sequentially stacked in a Z-direction.

The first, third, and fifth semiconductor layers 141, 143, and 145 may include the same semiconductor material, and the second and fourth semiconductor layers 142 and 144 include a semiconductor material different from the material of the first, third, and fourth semiconductor layers 141, 143, and 145. For example, the first, third, and fifth semiconductor layers 141, 143, and 145 may include silicon (Si), and the second and fourth semiconductor layers 142 and 144 may include silicon-germanium (SiGe).

In some embodiments, at least portions of the first, third, and fifth semiconductor layers 141, 143, and 145 may have different compositions. For example, the first and fifth semiconductor layers 141 and 145 may have the same composition, and the third semiconductor layer 143 may have a composition different from the composition of the first and fifth semiconductor layers 141 and 145. For example, the first and fifth semiconductor layers 141 and 145 may include silicon (Si), and the third semiconductor layer 143 may include carbon-doped silicon (Si:C).

In addition thereto, the above description of the second semiconductor layer 142 provided with reference to FIGS. 1 and 2 may be equally applied to the fourth semiconductor layer 144, and the above description of the first and third semiconductor layers 141 and 143 provided with reference to FIGS. 1 and 2 may be equally applied to the fifth semiconductor layer 145.

Referring to FIG. 4C, in a semiconductor device 100e, a shape of a second semiconductor layer 142 may be different from that of the example embodiment of FIG. 2. In the present embodiment, the second semiconductor layer 142 may have a non-uniform thickness. As illustrated in FIG. 4C, the second semiconductor layer 142 may have an island shape, but the shape of the second semiconductor layer 142 is not limited thereto. In this case, at least a portion of the second semiconductor layer 142 may be exposed through first side surfaces S1 and/or second side surfaces S2.

Figure 5:
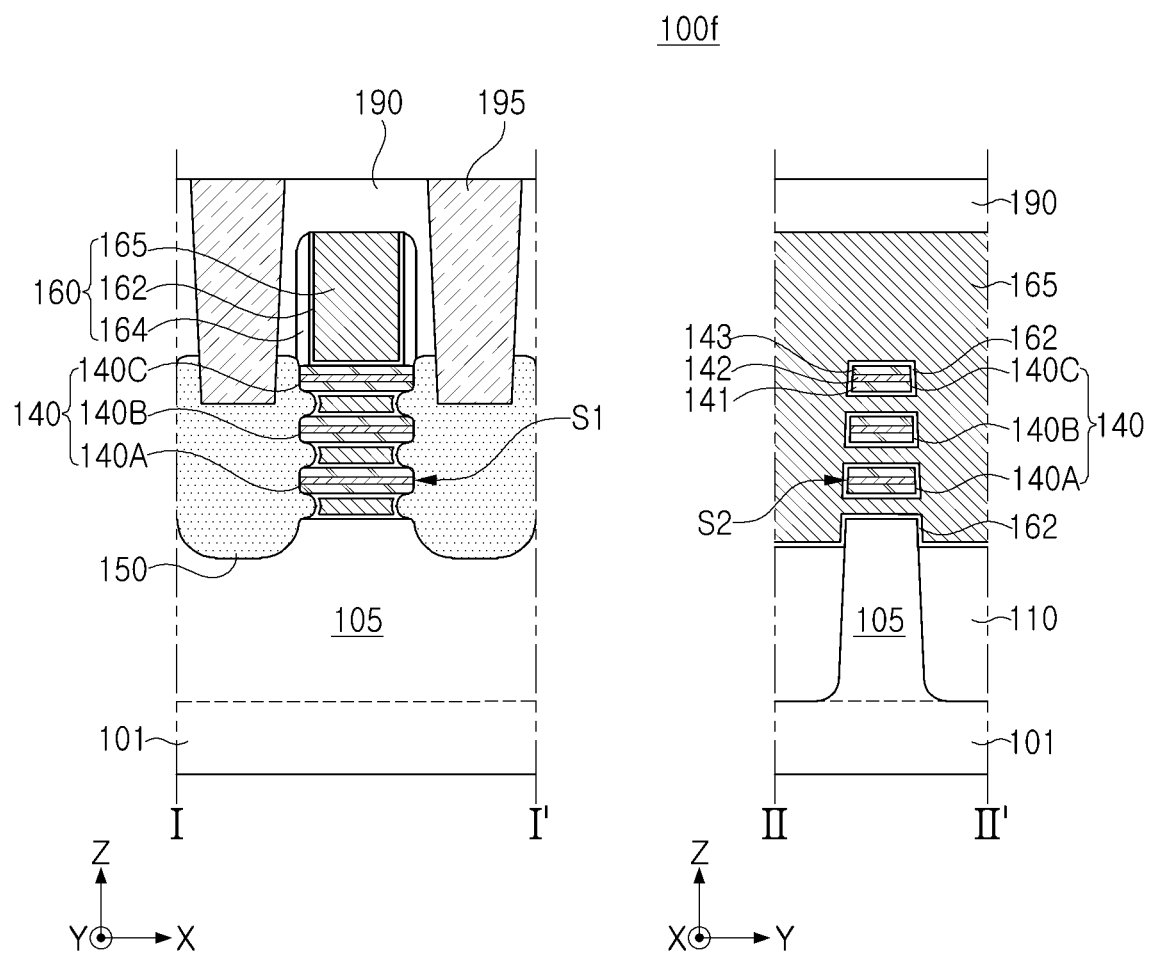
FIG. 5 is a schematic cross-sectional view illustrating a semiconductor device according to example embodiments.

FIG. 5 is a schematic cross-sectional view illustrating a semiconductor device according to example embodiments. FIG. 5 illustrates a region corresponding to FIG. 2.

Referring to FIG. 5, a semiconductor device 100f may not include the internal spacer layer 130, unlike the example embodiment of FIG. 2. In this case, source/drain regions 150 may have a shape expanding to a region in which the internal spacer layers 130 are omitted. A gate electrode 165 may be spaced apart from the first source/drain regions 150 by a gate dielectric layer 162. In another embodiment, the source/drain regions 150 may not expand to a region in which the internal spacer layers 130 are omitted, but the gate electrode 165 may be disposed to expand in an X-direction.

According to such a structure, the internal spacer layer 130 is omitted, so that the source/drain regions 150 may have improved crystallinity when the source/drain regions 150 are grown. In some embodiments, the internal spacer layer 130 may be omitted only in some structures/devices of the semiconductor device 100f.

Figure 6:
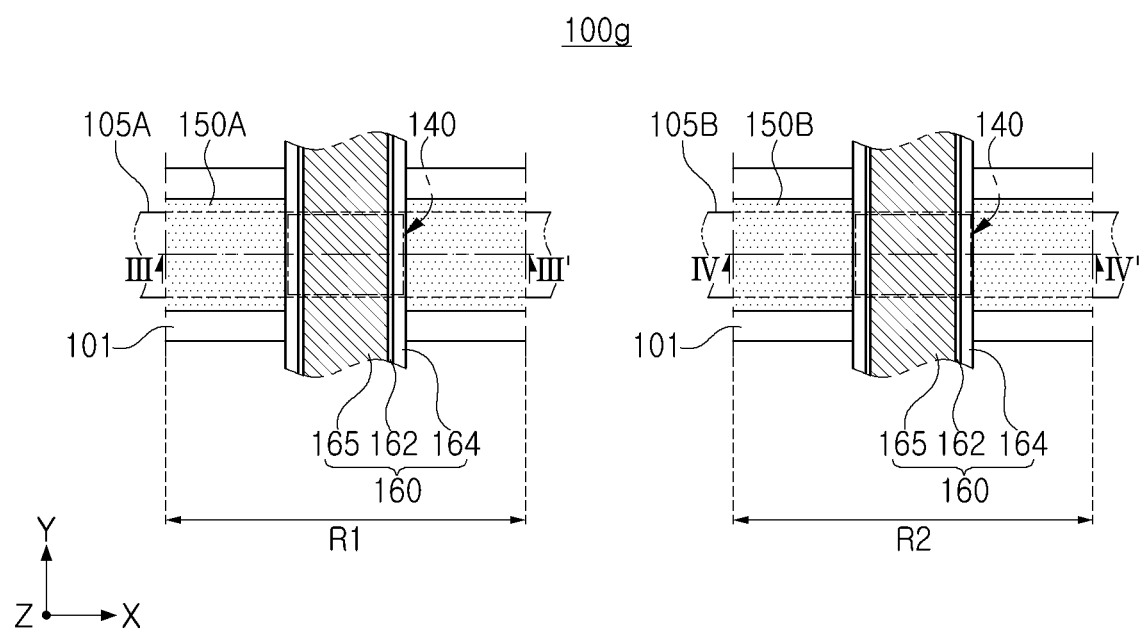
FIG. 6 is a plan view illustrating a semiconductor device according to example embodiments.

FIG. 6 is a plan view illustrating a semiconductor device according to example embodiments.

Figure 7:
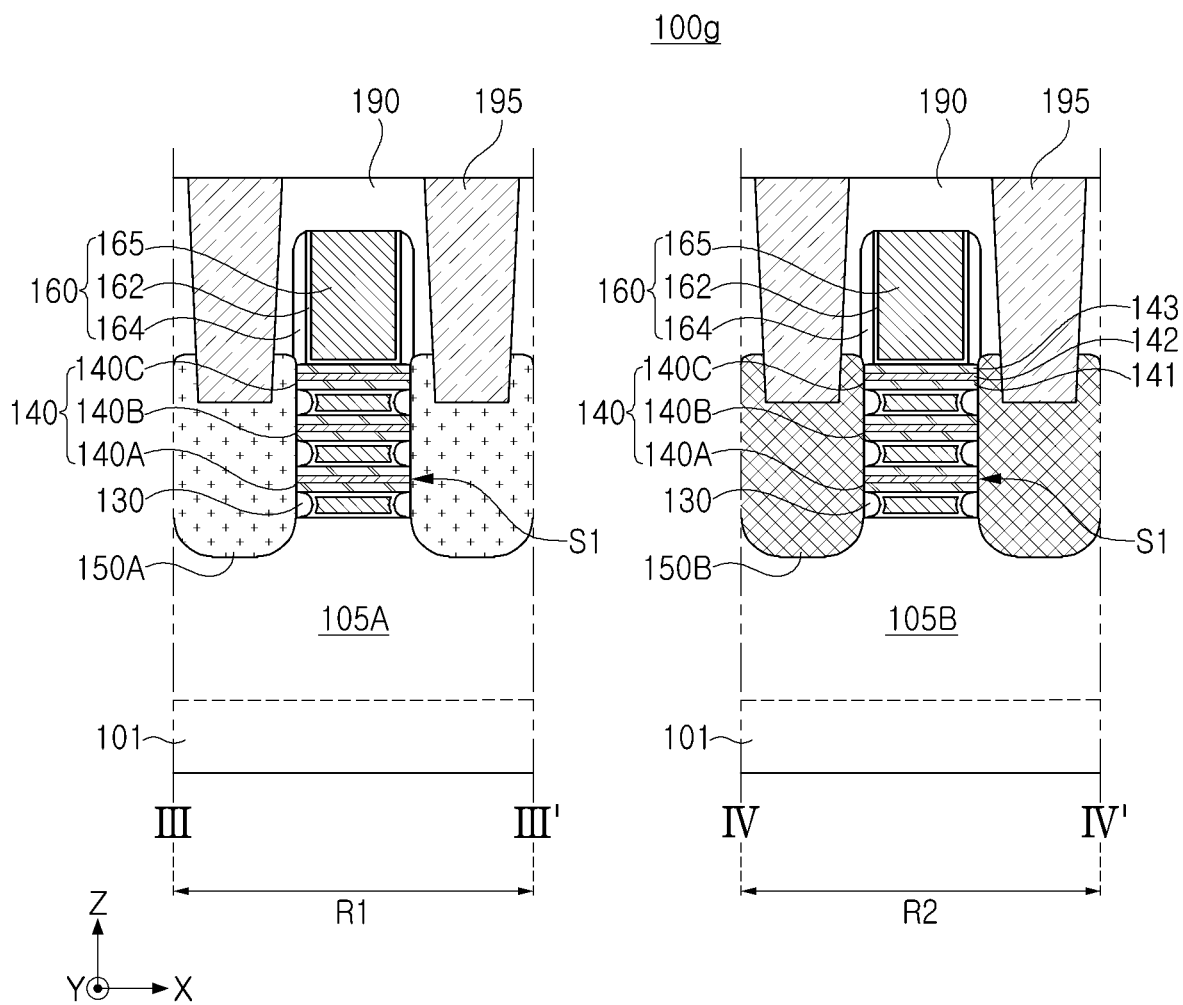
FIG. 7 is a cross-sectional view illustrating a semiconductor device according to example embodiments.

FIG. 7 is a cross-sectional view illustrating a semiconductor device according to example embodiments. FIG. 7 illustrates cross-sections of the semiconductor device of FIG. 6, taken along lines and IV-IV'. For ease of description, only some components of the semiconductor device are illustrated in FIG. 6.

Referring to FIGS. 6 and 7, a semiconductor device 100g may include first and second regions R1 and R2. The first and second regions R1 and R2 may be adjacent to each other or spaced apart from each other. A first active region 105A and first source/drain regions 150A may be disposed in the first region R1, and a second active region 105B and second source/drain regions 150B may be disposed in the second region R2. Other components including gate structures 160 may be disposed in the first and second regions R1 and R2, respectively. For example, the first region R1 may be a region in which a pFET is disposed, and the second region R2 may be a region in which an nFET is disposed.

Each of the first and second active regions 105A and 105B may include a well region including impurities. For example, in the first active region 105A of the first region R1 in which the pFET is disposed, the well region may include N-type impurities such as phosphorus (P), arsenic (As), or antimony (Sb). In the second active region 105B of the second region R2 in which the nFET is disposed, the well region may include P-type impurities such as boron (B), gallium (Ga), or aluminum (Al).

The first and second source/drain regions 150A and 150B may have the same internal structure. For example, the first and second source/drain regions 150A and 150B may include layers formed of the same material in the same shape. However, the first and second source/drain regions 150A and 150B may include impurities having different conductivity types. For example, both of the first and second source/drain regions 150A and 150B may include at least one silicon (Si) epitaxial layer or at least one silicon-germanium (SiGe) epitaxial layer. For example, the first source/drain regions 150A include a silicon (Si) layer doped with the P-type impurities, and the second source/drain regions 150B may include a silicon (Si) layer doped with the N-type impurities. In some embodiments, when the first and second source/drain regions 150A and 150B include a plurality of epitaxial layers, stacked forms of the plurality of epitaxial layers may be the same. In the present embodiment, even when the first source/drain regions 150A constitute a pFET, the first source/drain regions 150A may not include germanium (Ge), similarly to the second source/drain regions 150B. In some embodiments, the first source/drain regions 150A may include germanium (Ge).

In the first and second regions R1 and R2, channel structures 140 may have the same structure and may include the same material. The channel structures 140 may not include doping elements. In the present embodiment, the second semiconductor layers 142 include germanium (Ge), so that mobility of carriers may be secured. Thus, the first and second source/drain regions 150A and 150B may be formed based on the same material, irrespective of the type of transistor.

Figure 8A:
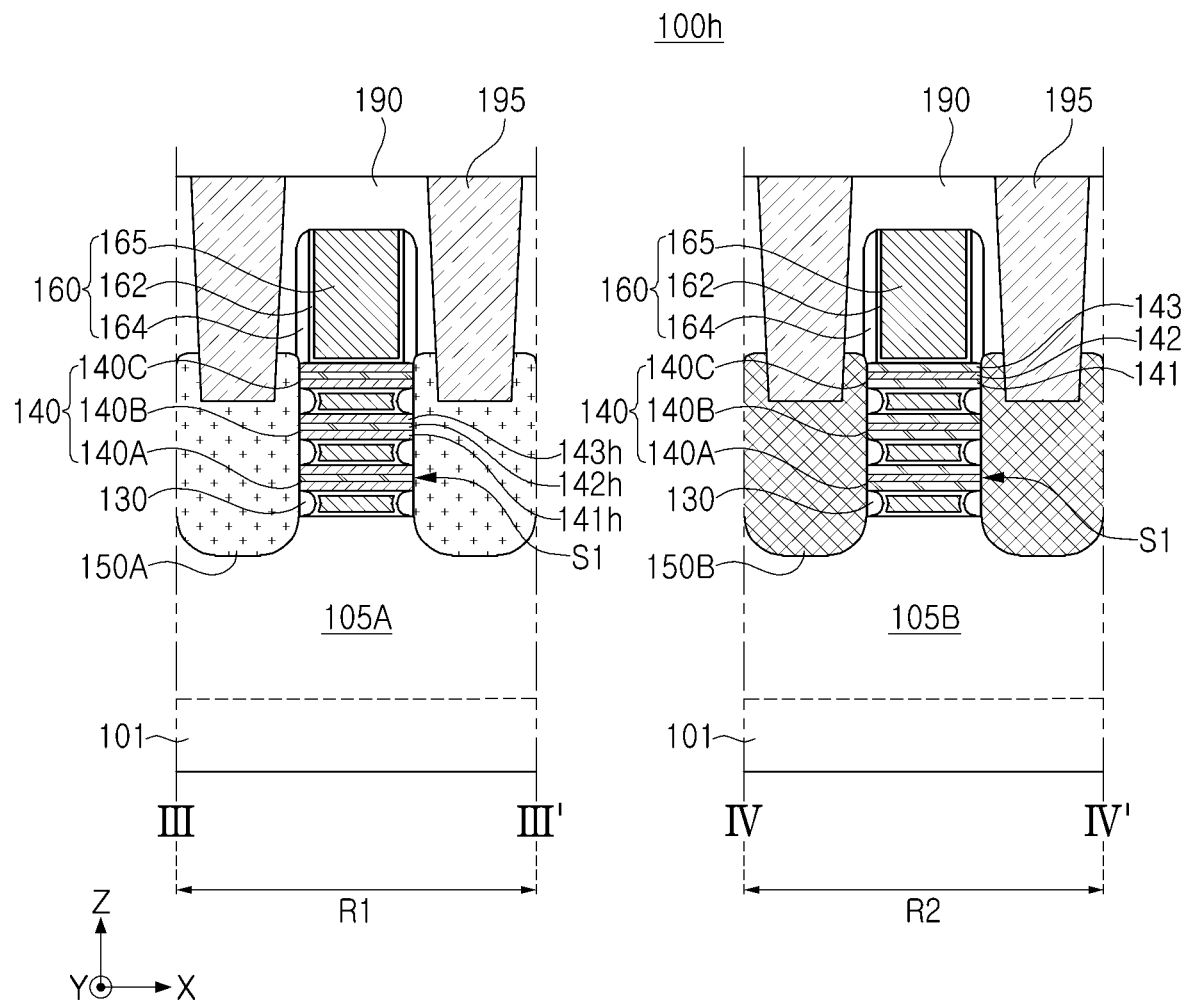
FIGS. 8A and 8B are schematic cross-sectional views illustrating a semiconductor device according to example embodiments.
Figure 8B:
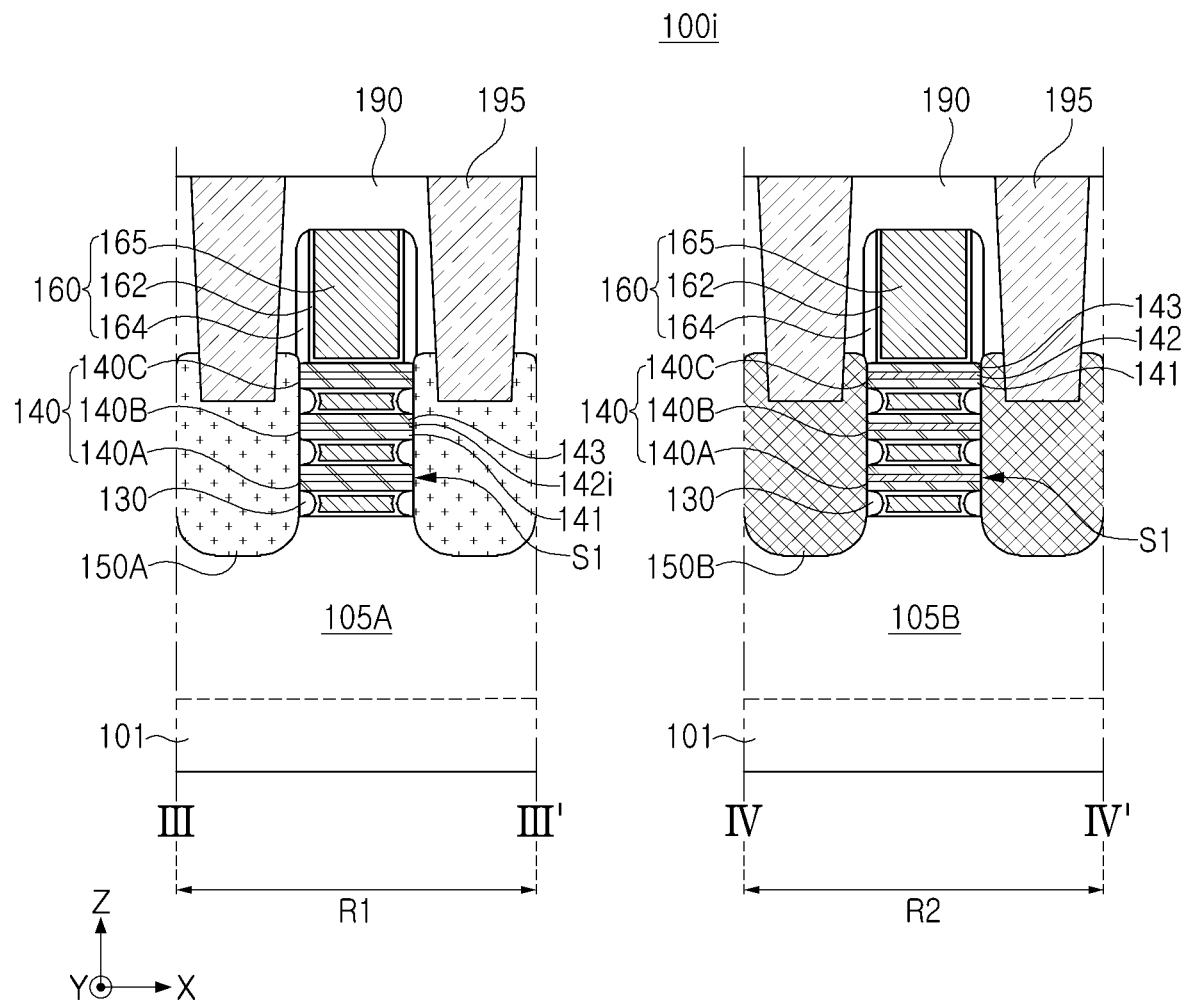

FIGS. 8A and 8B are schematic cross-sectional views illustrating semiconductor devices according to example embodiments. FIGS. 8A and 8B illustrate regions corresponding to FIG. 7.

Referring to FIG. 8A, in a semiconductor device 100h, a material of a channel structure 140 of a first region R1 may be different from that of the example embodiment of FIG. 7. For example, in the first region R1, first to third channel layers 140A, 140B, and 140C may each include first to third semiconductor layers 141h, 142h, and 143h sequentially stacked in a Z-direction. In the present embodiment, the first and third semiconductor layers 141*h* and 143*h* may include silicon-germanium (SiGe), and the second semiconductor layer 142*h* may include silicon (Si). For example, the first and third semiconductor layers 141*h* and 143*h* may include germanium (Ge) in a range of about 5 at % to about 50 at %, for example, about 5 at % to about 25 at %. In some embodiments, at least one of the first to third semiconductor layers 141*h*, 142*h*, or 143*h* may further include at least one of carbon (C), arsenic (As), indium (In), gallium (Ga), phosphorus (P), or boron (B). In addition thereto, the above description provided with reference to FIGS. 6 and 7 may be equally applied.

In some embodiments, the channel structure 140 of the second region R2 may include the first to third semiconductor layers 141*h*, 142*h*, and 143*h*, similarly to the channel structure 140 of the first region R1.

Referring to FIG. 8B, in a semiconductor device 100*i*, a material of a channel structure 140 of a first region R1 may be different from that of the example embodiment of FIG. 7. For example, in the first region R1, first to third channel layers 140A, 140B, and 140C may each include first to third semiconductor layers 141, 142*i*, and 143 sequentially stacked in a Z-direction. In the present embodiment, the first and third semiconductor layers 141 and 143 may include silicon (Si), and the second semiconductor layer 142*i* may include silicon (Si) doped with impurities. The first to third semiconductor layers 141, 142*i*, and 143 may be strained by the impurities. The impurities may include at least one of, for example, carbon (C), arsenic (As), indium (In), gallium (Ga), phosphorus (P), or boron (B). For example, when the second semiconductor layer 142*i* includes carbon (C) elements (i.e., dopants), a size of an element of carbon (C) is relatively smaller than a size of an element of silicon (Si). For this reason, compressive stress may be applied to the first and third semiconductor layers 141 and 143 to improve mobility of holes. In addition thereto, the above description provided with reference to FIGS. 6 and 7 may be equally applied.

In some embodiments, structures of the channel structure 140 in the first and second regions R1 and R2 of each of the example embodiments of FIGS. 7 to 8B may be disposed in various combinations.

Figure 9:
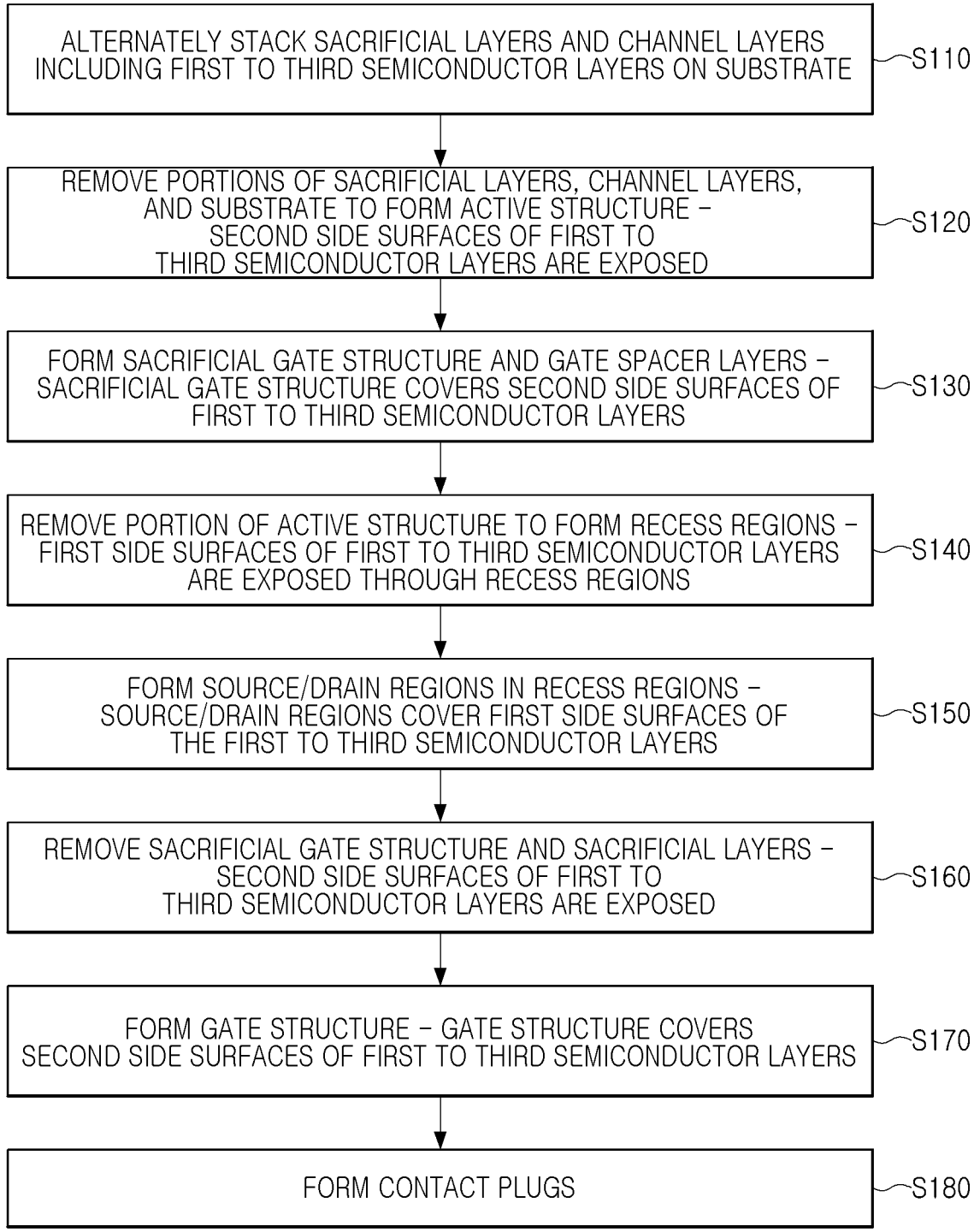
FIG. 9 is a flowchart illustrating a method of fabricating a semiconductor device according to example embodiments.

FIG. 9 is a flowchart illustrating a method of fabricating a semiconductor device according to example embodiments.

FIGS. 10A to 10G are views illustrating a process sequence of a method of fabricating a semiconductor device according to example embodiments. In FIGS. 10A to 10G, an example of a method of fabricating the semiconductor device of FIG. 2 will be described.

Figure 10A:
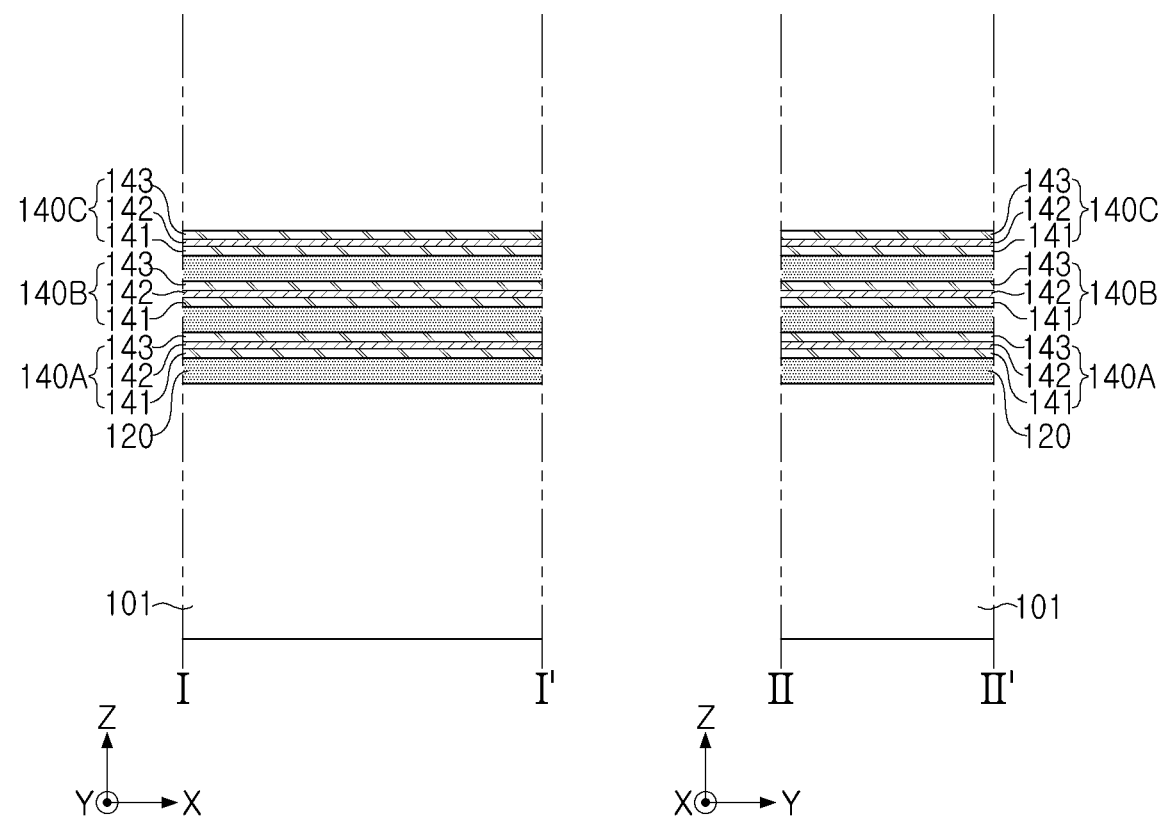
FIGS. 10A to 10G are cross-sectional views illustrating a process sequence of a method of fabricating a semiconductor device according to example embodiments.

Referring to FIGS. 9 and 10A, in operation S110, sacrificial layers 120 and the first to third channel layers 140A, 140B, and 140C may be alternately stacked on the substrate 101.

The sacrificial layers 120 may be replaced with the gate dielectric layers 162 and the gate electrode 165 below the third channel layer 140C in a subsequent process, as illustrated in FIG. 2. Each of the sacrificial layers 120 may be formed of a material having etching selectivity with respect to the first to third channel layers 140A, 140B, and 140C.

Each of the first to third channel layers 140A, 140B, and 140C may include first to third semiconductor layers 141, 142, and 143. The first to third channel layers 140A, 140B, and 140C may include a material, different from a material of the sacrificial layers 120. For example, the sacrificial layers 120 may include silicon-germanium (SiGe), the first and third semiconductor layers 141 and 143 may include silicon (Si), and the second semiconductor layer 142 may include silicon-germanium (SiGe) having a composition different from a composition of the sacrificial layers 120. The sacrificial layers 120 may include germanium (Ge) having a concentration higher than a concentration of germanium (Ge) included in the second semiconductor layer 142. For example, a content of germanium (Ge) in the sacrificial layers 120 may be within a range of about 30 at % to about 50 at %, and a content of germanium in the second semiconductor layer 142 may be selected as a value lower than that of the sacrificial layers 120, within a range of about 5 at % to about 50 at %. For example, the content of germanium (Ge) in the second semiconductor layer 142 may be in a range of about 5 at % to about 25 at %.

The sacrificial layers 120 and the first to third channel layers 140A, 140B, and 140C may be formed by performing an epitaxial growth process from the substrate 101. The number of layers of the first to third channel layers 140A, 140B, and 140C, stacked alternately with the sacrificial layers 120, may vary according to example embodiments.

Figure 10B:
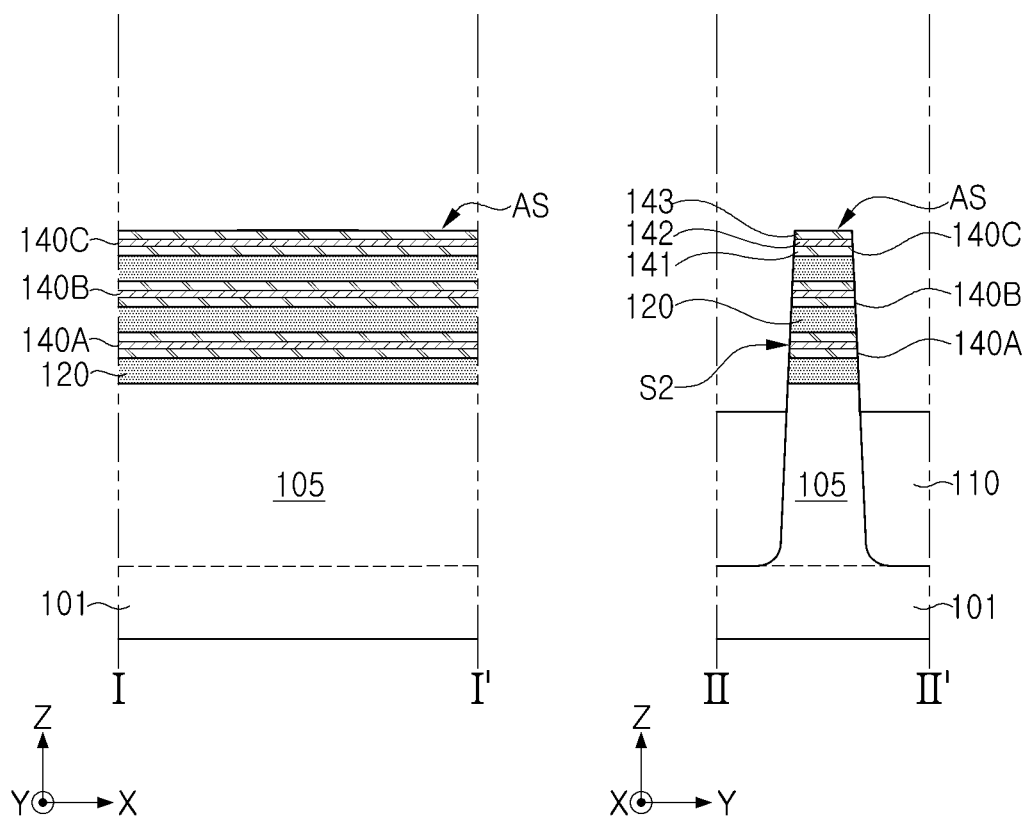

Referring to FIGS. 9 and 10B, in operation S120, portions of the sacrificial layers 120, the first to third channel layers 140A, 140B, and 140C, and the substrate 101 may be removed to form an active structure AS including the active region 105.

The active structure AS may be formed by patterning the sacrificial layers 120, the first to third semiconductor layers 141, 142, and 143, and an upper region of the substrate 101. The active structure AS may include sacrificial layers 120 and first to third channel layers 140A, 140B, and 140C stacked alternately with each other, and may further include the active region 105 formed to protrude upwardly by removing a portion of the substrate 101. The active structure AS may be formed to have a line shape extending in one direction, for example, the X-direction. Side surfaces of the active structure AS may be inclined to increase in width, while being directed downwardly, depending on an aspect ratio. Second side surfaces S2 of the first to third semiconductor layers 141, 142, and 143 in a Y-direction may be exposed through side surfaces of the active structure AS.

In a region in which a portion of the substrate 101 is removed, an isolation layer 110 may be formed by filling the region with an insulating material and then removing a portion of the insulating material such that the active region 105 protrudes. An upper surface of the isolation layer 110 may be formed to be lower than an upper surface of the active region 105.

Figure 10C:
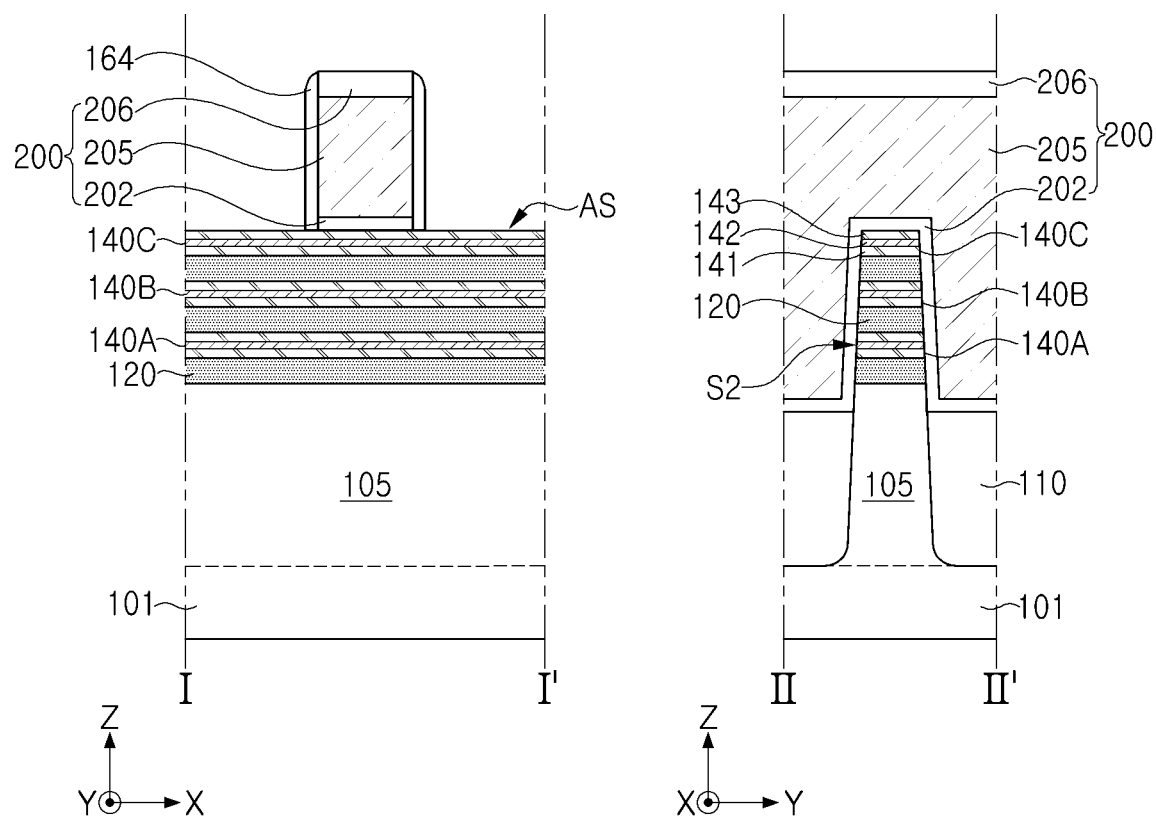

Referring to FIGS. 9 and 10C, in operation S130, a sacrificial gate structure 200 and gate spacer layers 164 may be formed on the active structure AS.

The sacrificial gate structure 200 may be a sacrificial structure formed in a region in which the gate dielectric layer 162 and the gate electrode 165 are disposed on the channel structure 140 in a subsequent process, as illustrated in FIG. 2. The sacrificial gate structure 200 may have a line shape intersecting the active structure AS and extending in one direction. The sacrificial gate structure 200 may extend in the Y-direction, for example. The sacrificial gate structure 200 may include first and second sacrificial gate layers 202 and 205 and a mask pattern layer 206 sequentially stacked. The first and second sacrificial gate layers 202 and 205 may be patterned using a mask pattern layer 206. The second side surfaces S2 of the first to third semiconductor layers 141, 142, and 143 may be covered with the first sacrificial gate layer 202.

The first and second sacrificial gate layers 202 and 205 may be an insulating layer and a conductive layer, respectively. However, example embodiments are not limited thereto, and the first and second sacrificial gate layers 202 and 205 may be formed as a single layer. For example, the first sacrificial gate layer 202 may include silicon oxide, and the second sacrificial gate layer 205 may include polysilicon. The mask pattern layer 206 may include silicon oxide and/or silicon nitride.

Gate spacer layers 164 may be formed on opposite sidewalls of the sacrificial gate structure 200. The gate spacer layers 164 may be formed of a low-K dielectric material, and may include at least one of, for example, SiO, SiN, SiCN, SiOC, SiON, or SiOCN.

Figure 10D:
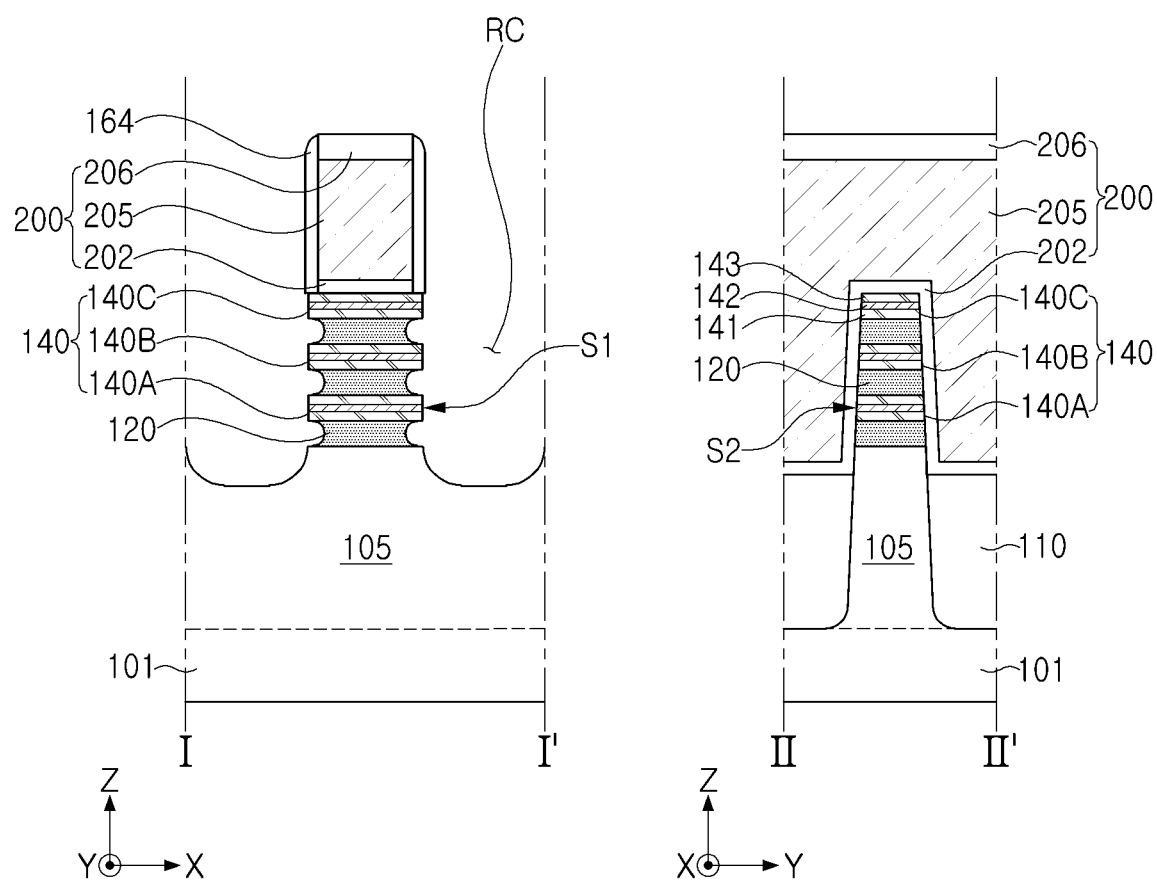

Referring to FIGS. 9 and 10D, in operation S140, a portion of the exposed sacrificial layers 120 and the exposed sacrificial first to third channel layers 140A, 140B, and 140C may be removed from the sacrificial gate structure 200 to form recess regions RC, and a portion of the sacrificial layers 120 may be removed.

A portion of the exposed sacrificial layers 120 and a portion of the exposed first to third channel layers 140A, 140B, and 140C may be removed using the sacrificial gate structure 200 and the gate spacer layers 164 as masks to form the recess regions RC. Accordingly, the first to third channel layers 140A, 140B, and 140C may constitute a channel structure 140 having a length limited in the X-direction. The side surfaces S1 of the first to third semiconductor layers 141, 142, and 143 in the X-direction may be exposed through the recess regions RC.

The sacrificial layers 120 may be selectively etched with respect to the channel structures 140 and the sacrificial layers 120 by, for example, a wet etching process to be removed to a predetermined depth from the side surface in the X-direction. The sacrificial layers 120 may have inwardly concave side surfaces by side etching, as described above. However, a specific shape of the side surfaces of the sacrificial layers 120 is not limited to that illustrated in FIG. 10D.

Figure 10E:
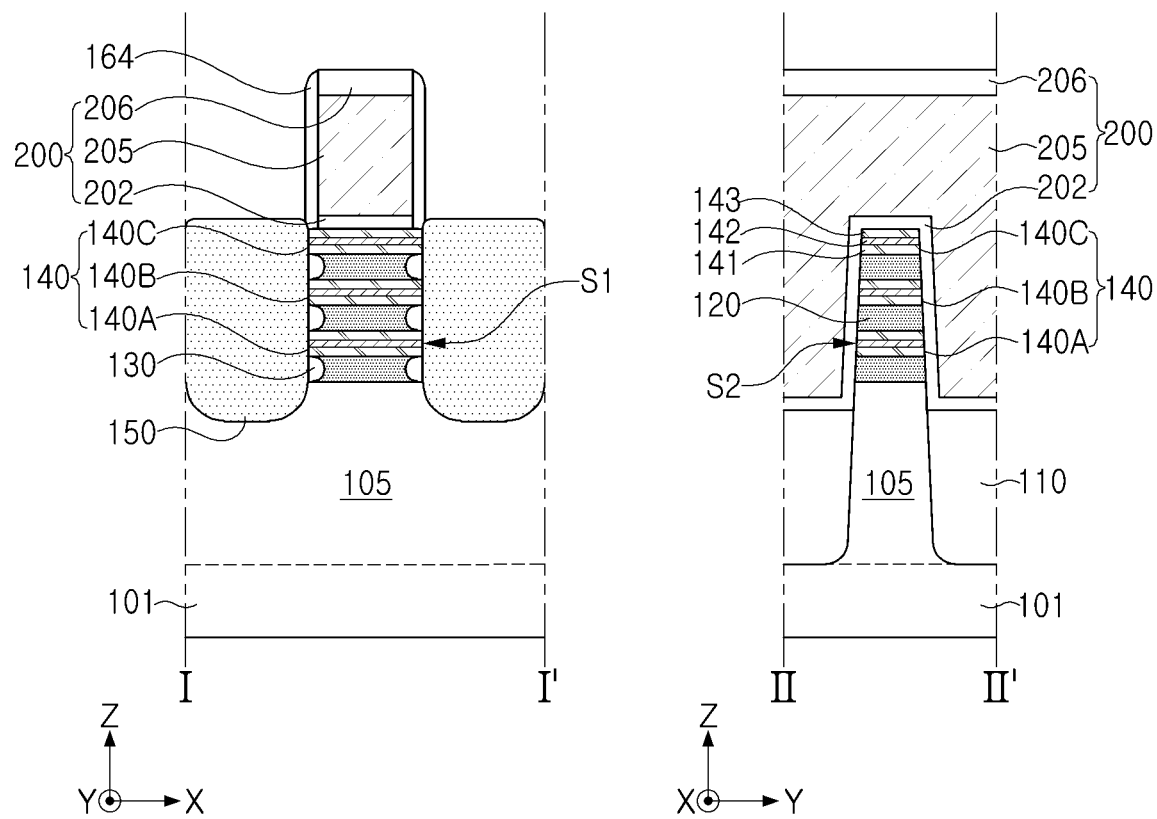

Referring to FIGS. 9 and 10E, in operation S150, internal spacer layers 130 may be formed and source/drain regions 150 may be formed in the recess regions RC.

The internal spacer layers 130 may be formed by filling the region, in which the sacrificial layers 120 are removed, with an insulating material and then removing the insulating material deposited on an external side of the channel structure 140. The internal spacer layers 130 may be formed of the same material as the gate spacer layers 164, but example embodiments are not limited thereto. For example, the internal spacer layers 130 may include at least one of SiN, SiCN, SiOCN, SiBCN, or SiBN.

The source/drain regions 150 may be formed by growth from side surfaces of the active region 105 and the channel structure 140 by, for example, a selective epitaxial process. The source/drain regions 150 may include impurities by in-situ doping or ex-situ doping, and may include a plurality of layers having different doping elements and/or different doping concentrations. The source/drain regions 150 may cover the first side surfaces S1 of the first to third semiconductor layers 141, 142, and 143.

Figure 10F:
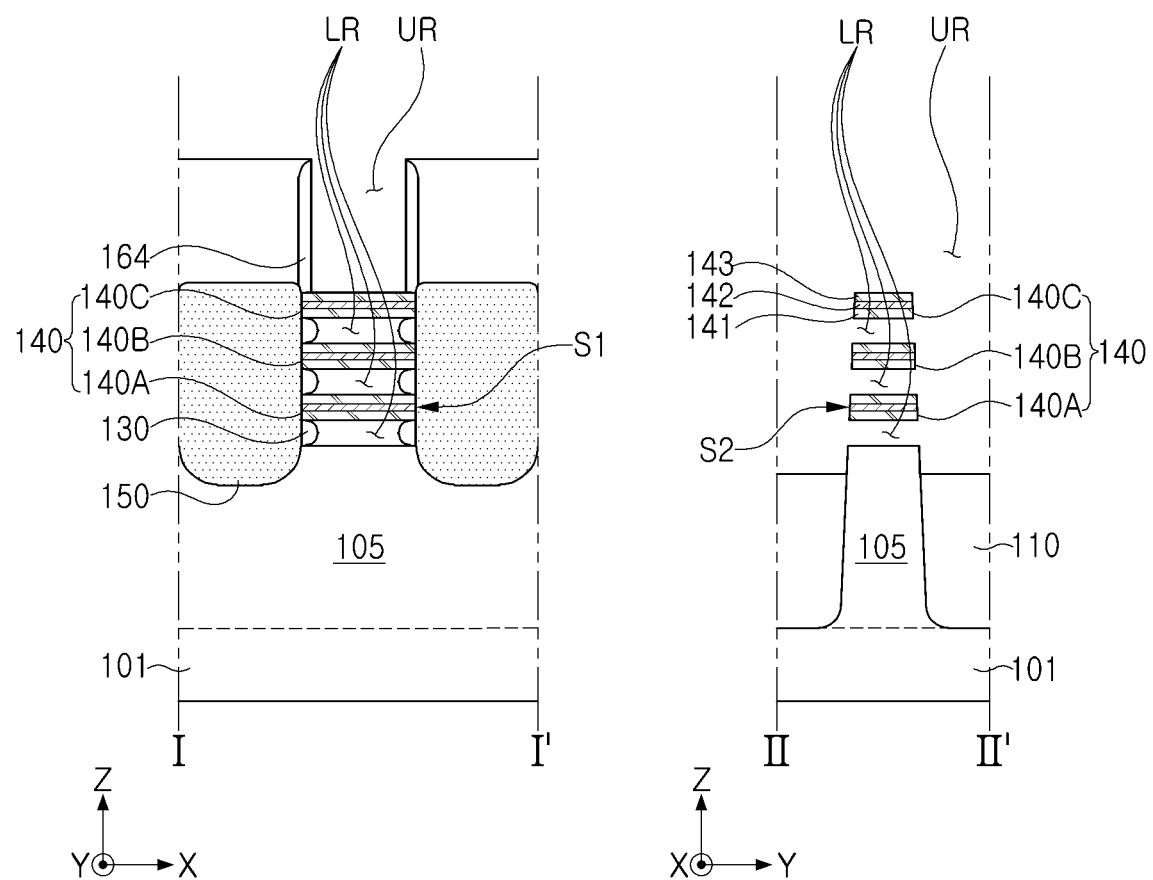

Referring to FIGS. 9 and 10F, in operation S160, an interlayer insulating layer 190 (FIG. 10G) may be formed, and a sacrificial gate structure 200 and sacrificial layers 120 may be removed.

The interlayer insulating layer 190 may be formed by forming an insulating layer to cover the sacrificial gate structure 200 and the source/drain regions 150 and performing a planarization process to expose a mask pattern layer 206.

The sacrificial gate structure 200 and the sacrificial layers 120 may be selectively removed with respect to the gate spacer layers 164, the interlayer insulating layer 190, the channel structure 140, and the internal spacer layers 130. The sacrificial gate structure 200 may be removed to form an upper gap region UR, and then the sacrificial layers 120 exposed through the upper gap region UR may be removed to form a lower gap regions LR. When the sacrificial layers 120 include silicon-germanium (SiGe) and the first and third semiconductor layers 141 and 143 of the channel structure 140 include silicon (Si), the sacrificial layers 120 may be selectively removed with respect to the first and third semiconductor layers 141 and 143 by performing a wet etching process.

Although the second semiconductor layer 142 includes silicon-germanium (SiGe), a content of germanium (Ge) in the second semiconductor layer 142 is lower than a content of germanium (Ge) in the sacrificial layers 120, so that the sacrificial layers 120 may also be selectively removed with respect to the second semiconductor layer 142. Accordingly, the second side surfaces S2 of the first to third semiconductor layers 141, 142, and 143 may be exposed.

In the case of the example embodiment of FIG. 3A, in this operation, when the sacrificial layers 120 are removed, the second semiconductor layers 142 may also be partially removed from the exposed second side surfaces S2a to fabricate a semiconductor device. In the case of the example embodiment of FIG. 3B, in this operation, the side protection layers 135 may be selectively formed on exposed second side surfaces S2b of the second semiconductor layers 142 through an oxidation process, or the like, and then a process of removing the sacrificial layers 120 may be performed to fabricate a semiconductor device.

Figure 10G:
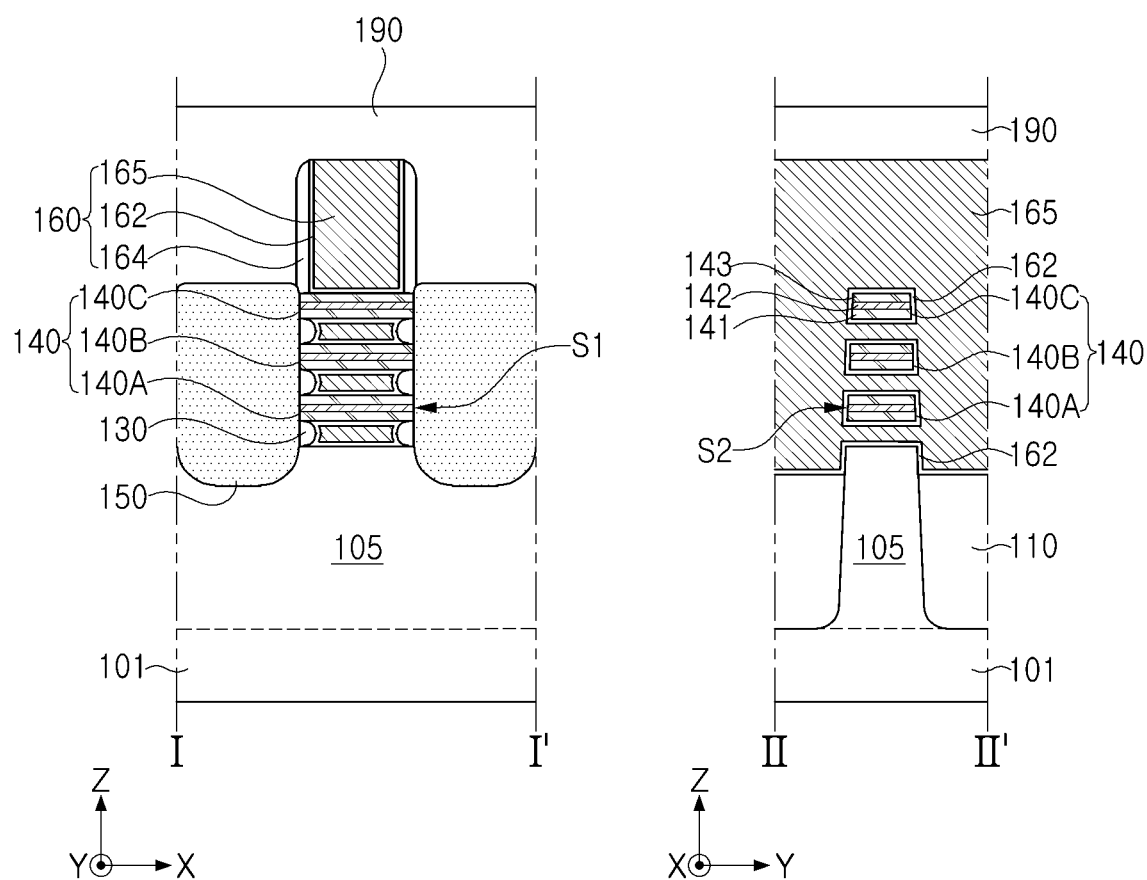

Referring to FIGS. 9 and 10G, in operation S170, a gate structure 160 may be formed.

The gate structure 160 may be formed in (e.g., to fill) the upper gap region UR and the lower gap regions LR. The gate dielectric layers 162 may be formed to conformally cover internal surfaces of the upper gap region UR and the lower gap regions LR. The gate electrode 165 may be formed to completely fill the upper gap region UR and the lower gap regions LR, and may then be removed from above in the upper gap regions UR to a predetermined depth, together with the gate dielectric layers and the gate spacer layers 164. Accordingly, a gate structure 160 including the gate dielectric layers 162, the gate electrode 165, and the gate spacer layers 164 may be formed. The second side surfaces S2 of the first to third semiconductor layers 141, 142, and 143 may be covered with the gate dielectric layers 162 of the gate structure 160.

The gate structure 160 is formed, and then an interlayer insulating layer 190 may be further formed on the gate structure 160. For example, the interlayer insulating layer 190 may be formed to a first height, in the Z-direction, as shown in FIG. 10F, and then may be formed to a second height, in the Z-direction, as shown in FIG. 10G, where the second height is higher than the first height.

Referring to FIGS. 9 and 2, in operation S180, contact plugs 195 may be formed.

By patterning the interlayer insulating layer 190, contact holes may be formed to expose the source/drain regions 150. Then, the contact holes may be filled with a conductive material to form contact plugs 195. For example, the contact holes may be filled with a material forming a barrier layer, and then a silicidation process may be performed to form a metal-semiconductor compound layer such as a silicide layer on a lower end thereof. Then, a conductive material may be deposited to fill the contact holes, so that the contact plugs 195 may be formed. Accordingly, the semiconductor device 100 of FIGS. 1 and 2 may be fabricated.

As described above, a semiconductor device may include a channel layer including a plurality of semiconductor layers including different materials, to improve electrical characteristics and mass producibility.

While example embodiments have been shown and described above, it will be apparent to those skilled in the art that modifications and variations could be made without departing from the scope of the present invention as defined by the appended claims.

What is claimed is:

1. A semiconductor device comprising:
    a substrate including an active region extending in a first direction;
    a gate structure intersecting the active region on the substrate and extending in a second direction;
    a plurality of channel layers spaced apart from each other in a third direction, perpendicular to an upper surface of the substrate, on the active region and surrounded by the gate structure; and
    source/drain regions in recess regions of the active region, on opposite sides adjacent to the gate structure and electrically connected to the plurality of channel layers,
    wherein each of the plurality of channel layers includes first to third semiconductor layers sequentially stacked in the third direction, such that the second semiconductor layer is between the first and third semiconductor layers,
    wherein the first and third semiconductor layers include silicon (Si), and the second semiconductor layer includes silicon-germanium (SiGe), and
    wherein side surfaces of the first to third semiconductor layers in the second direction are in contact with the gate structure.

2. The semiconductor device of claim 1, wherein the side surfaces of the first to third semiconductor layers in the second direction are coplanar with each other.

3. The semiconductor device of claim 1, wherein each of the first to third semiconductor layers is a planar layer having an upper surface that is parallel to the upper surface of the substrate.

4. The semiconductor device of claim 1, wherein the first to third semiconductor layers extend in the first direction by substantially the same length.

5. The semiconductor device of claim 1, wherein side surfaces of the first to third semiconductor layers in the first direction are in contact with the source/drain regions.

6. The semiconductor device of claim 1, wherein the second semiconductor layer includes germanium (Ge) within a range of about 5 at % to about 50 at %.

7. The semiconductor device of claim 1, wherein the second semiconductor layer further includes at least one of carbon (C), arsenic (As), indium (In), gallium (Ga), phosphorus (P), or boron (B).

8. The semiconductor device of claim 1, further comprising:
    internal spacer layers between the gate structure and the source/drain regions in the first direction,
    wherein the internal spacer layers are in contact with the first and third semiconductor layers in the third direction.

9. The semiconductor device of claim 8, wherein external side surfaces of the internal spacer layers in the first direction are coplanar with side surfaces of the first to third semiconductor layers in the first direction.

10. The semiconductor device of claim 1,
    wherein the gate structure includes a gate dielectric layer and a gate electrode on the gate dielectric layer, and
    wherein the side surfaces of the first to third semiconductor layers in the second direction are in contact with the gate dielectric layer.

11. The semiconductor device of claim 10, wherein the gate dielectric layer extends along a lower surface of the first semiconductor layer, the side surfaces of the first to third semiconductor layers, and an upper surface of the third semiconductor layer to surround each of the plurality of channel layers, in a cross-section in the second direction.

12. The semiconductor device of claim 1,
    wherein each of the plurality of channel layers further includes:
        a fourth semiconductor layer on the third semiconductor layer and including SiGe; and
        a fifth semiconductor layer on the fourth semiconductor layer and including Si, and
    wherein the fourth semiconductor layer is between, in the third direction, the third and fifth semiconductor layers.

13. The semiconductor device of claim 1, wherein a width of the second semiconductor layer in the second direction is narrower than respective widths of the first and third semiconductor layers in the second direction.

14. A semiconductor device comprising:
    a substrate having first and second regions and including first and second active regions respectively extending in the first and second regions in a first direction;
    a first gate structure intersecting the first active region on the first region and extending in a second direction;
    a second gate structure intersecting the second active region on the second region and extending in the second direction;
    a plurality of channel layers spaced apart from each other in a third direction, perpendicular to an upper surface of the substrate, on each of the first and second active regions and surrounded by each of the first and second gate structures;
    first source/drain regions on opposite sides adjacent to the first gate structure and electrically connected to the plurality of channel layers; and
    second source/drain regions on opposite sides adjacent to the second gate structure and electrically connected to the plurality of channel layers;
    wherein each of the plurality of channel layers includes first to third semiconductor layers sequentially stacked in the third direction, such that the second semiconductor layer is between the first and third semiconductor layers, and extending parallel to each other in the first and second directions,
    wherein at least one of the first to third semiconductor layers includes silicon-germanium (SiGe); and
    wherein the second semiconductor layer in the first region includes a material different from a material of the second semiconductor layer in the second region.

15. The semiconductor device of claim 14,
    wherein the first and second source/drain regions include silicon (Si),
    wherein the first source/drain regions include a first impurity having a first conductivity type, and
    wherein the second source/drain regions include a second impurity having a second conductivity type that is different from the first conductivity type.

16. The semiconductor device of claim 15, wherein the first and second source/drain regions do not include germanium (Ge).

17. The semiconductor device of claim 14, wherein in the first region, the first and third semiconductor layers include SiGe and the second semiconductor layer includes silicon (Si).

18. A semiconductor device comprising:
a substrate including an active region extending in a first direction;
a gate structure intersecting the active region on the substrate and extending in a second direction;
a plurality of channel layers spaced apart from each other in a third direction, perpendicular to an upper surface of the substrate, on the active region and surrounded by the gate structure; and
source/drain regions in recess regions of the active region, on opposite sides adjacent to the gate structure and electrically connected to the plurality of channel layers,
wherein each of the plurality of channel layers includes first and second semiconductor layers sequentially stacked, such that the first semiconductor layer is below the second semiconductor layer,
wherein the second semiconductor layer includes silicon-germanium (SiGe), and
wherein side surfaces of the first and second semiconductor layers in the second direction are coplanar with each other;
wherein each of the plurality of channel layers further includes a third semiconductor layer on the second semiconductor layer,
wherein the second semiconductor layer is between, in the third direction, the first and third semiconductor layers, and
wherein a content of germanium (Ge) in each of the first and third semiconductor layers is lower than a content of Ge in the second semiconductor layer.

* * * * *